US008683404B2

(12) United States Patent
Hosokawa

(10) Patent No.: US 8,683,404 B2
(45) Date of Patent: Mar. 25, 2014

(54) SEMICONDUCTOR VERIFICATION APPARATUS, METHOD, AND PROGRAM

(75) Inventor: Kohei Hosokawa, Minato-ku (JP)

(73) Assignee: NEC Corporation, Tokyo (JP)

( * ) Notice: Subject to any disclaimer, the term of this patent is extended or adjusted under 35 U.S.C. 154(b) by 528 days.

(21) Appl. No.: 13/056,092

(22) PCT Filed: Apr. 20, 2009

(86) PCT No.: PCT/JP2009/057862
§ 371 (c)(1),
(2), (4) Date: Jan. 26, 2011

(87) PCT Pub. No.: WO2010/016300
PCT Pub. Date: Feb. 11, 2010

(65) Prior Publication Data
US 2011/0138364 A1    Jun. 9, 2011

(30) Foreign Application Priority Data

Aug. 5, 2008   (JP) ................................. 2008-202475

(51) Int. Cl.
*G06F 17/50* (2006.01)

(52) U.S. Cl.
USPC ........................................................ 716/110

(58) Field of Classification Search
USPC ................................................ 716/100, 110
See application file for complete search history.

(56) References Cited

U.S. PATENT DOCUMENTS

| 6,286,114 B1 | 9/2001 | Veenstra et al. |
| 2004/0254906 A1 | 12/2004 | Shei et al. |
| 2007/0050584 A1* | 3/2007 | Asauchi ........................ 711/163 |
| 2007/0180413 A1 | 8/2007 | Park |
| 2009/0129149 A1* | 5/2009 | Fujisawa et al. .......... 365/185.03 |
| 2011/0176373 A1* | 7/2011 | Fujiu ........................ 365/189.09 |
| 2011/0188319 A1* | 8/2011 | Harada et al. ............. 365/185.22 |
| 2011/0191735 A1* | 8/2011 | Hosokawa ..................... 716/108 |
| 2011/0235431 A1* | 9/2011 | Takagiwa ................ 365/185.22 |
| 2013/0010541 A1* | 1/2013 | Futatsuyama et al. ... 365/185.22 |
| 2013/0070532 A1* | 3/2013 | Nawata .................... 365/185.22 |
| 2013/0117507 A1* | 5/2013 | Chiang ........................ 711/115 |
| 2013/0176791 A1* | 7/2013 | Sakakibara .............. 365/185.21 |

FOREIGN PATENT DOCUMENTS

| JP | 11-259328 A | 9/1999 |
| JP | 11-296403 A | 10/1999 |
| JP | 11-345134 A | 12/1999 |
| JP | 2000-162277 A | 6/2000 |
| JP | 2004-038387 A | 2/2004 |
| JP | 2004-213723 A | 7/2004 |
| JP | 2004-280426 A | 10/2004 |
| JP | 2005-084957 A | 3/2005 |
| JP | 2005-174349 A | 6/2005 |
| JP | 2006-329682 A | 12/2006 |
| JP | 2007-527060 A | 9/2007 |

OTHER PUBLICATIONS

Virtex-4 Configuration Guide UG07 (v1.3) Aug. 16, 2005, pp. 91-107 XILINX Corporation.
Virtex-4 Configuration Guide UG071(v1.6) Jun. 21, 2007, pp. 99-115 XILINX Corporation.

* cited by examiner

*Primary Examiner* — Suchin Parihar
(74) *Attorney, Agent, or Firm* — Sughrue Mion, PLLC

(57) ABSTRACT

A memory is provided for storing a control sequence of a clock cycle for each semiconductor device. The program sequence is calculated in advance and written in the memory by a program etc. on a computer. When the relevant semiconductor device is controlled, the contents of the memory are provided to the semiconductor device.

20 Claims, 21 Drawing Sheets

Fig.2

| name of memory element | number information | |
|---|---|---|
| | first number | second number |
| A | 0x1024 | 0x20 |
| B | 0x0384 | 0x38 |
| C | 0x2578 | 0x01 |
| D | 0x1024 | 0x0A |

Fig.3

| command | value |
|---|---|
| device stop command | 0x300 |
| first number command | 0x005+first number(32bit) |
| read command | 0x001 |
| device start command | 0x301 |

Fig.9

```
;<offset>    <frame address>    <frame offset>    <information>
Bit  38061   0x0000001d         13 Block=UK29    Latch=I  Net=test/inst/signal_x
Bit  38098   0x0000001d         50 Block=UP50    Latch=I  Net=test/inst/signal_y
```

Fig.14

| name of a memory element whose value is desired to be retrieved | first number | second number |
|---|---|---|
| P | 0xA | 0x3 |
| Q | 0xC | 0x1 |
| R | 0xB | 0x7 |
| S | 0xA | 0x2 |
| T | 0xB | 0x1 |
| U | 0xA | 0x9 |

Fig.16

| retrieval procedure | first number | second number | name of memory element |
|---|---|---|---|
| 1 | 0xA | 0x2 | S |
|   |     | 0x3 | P |
|   |     | 0x9 | U |
| 2 | 0xB | 0x1 | T |
|   |     | 0x7 | R |
| 2 | 0xC | 0x1 | Q | first entry: rows with S, P
second entry: rows with U, T, R
third entry: row with Q

SEMICONDUCTOR VERIFICATION APPARATUS, METHOD, AND PROGRAM

TECHNICAL FIELD

The present invention relates to a semiconductor verification apparatus, method, and program.

BACKGROUND ART

For purposes of fully explaining the current technical levels regarding the present invention, the patents, patent applications, patent publications, scientific literatures and etc. that are referenced or specified are all incorporated herein by reference Due to the progress in the semiconductor technology, the degree of integration of semiconductor devices (logical LSIs [Large Scale Integrated circuits]) has been increasing year by year, thus making it possible to integrate a large-scale system into one chip. However, since semiconductor devices are very costly and take a long time to manufacture, it is critical to perform adequate verification thereof prior to manufacturing.

Verification of semiconductor devices is performed at a variety of design phases. Design processes include a number of stages from an abstract level at an initial design to a detailed manufacturing level at a final stage, and handle logical information depending on each level. For example, at an initial design phase, logical information of an abstract level which defines relationships between inputs and outputs; at a functional design stage, logical information of a functional level which defines functions of each logical section; and a final detailed design stage, logical information of a structural level which defines a logical structure, are each handled. Logical information of the aforementioned variety of design stages can be expressed in various hardware descriptive languages (SystemC, SystemVerilog, Verilog-HDL, VHL etc.) which are commonly used.

A method of logical verification of a semiconductor device or a system using semiconductor devices includes those that use a software simulator, a hardware simulator and an actual semiconductor device. The software simulator can be used at a variety of design stages because it executes logical information described in hardware descriptive language as computer programs. The software simulator also has the advantage that values of all variables in a hardware descriptive language can be readily observed because it executes operations of circuits as computer programs.

On the other hand, actual semiconductor devices and hardware emulators can execute logical operations at higher speeds than the software emulator because they are hardware. In general, the hardware emulator is a device constituted by a rewritable hardware (programmable logic device), such as FPGA (Field Programmable Gate Array), FPID (Field Programmable Interconnect Device) etc. However, general semiconductor devices and hardware simulators are problematic in that, since they are unable to observe all signals for reasons of cost, hardware constraints and etc., it is difficult for them to debug circuits.

In order to overcome the above-mentioned problem, Patent Documents 1 and 2 disclose an approach to read values of memory elements implemented in any FPGA without support of spatial hardware, by controlling the function of a lead back capture possessed by FPGA through JTAG (Joint Test Action Group) (IEEE1149.1) which is a standard for a boundary scan test, a test accessory support, etc. This approach significantly alleviates the observation problem associated with the hardware simulator described above.

PRIOR ART DOCUMENT

Patent Document

Patent Document 1: JP2005-174349A, paragraph 0055
Patent Document 2: JP2006-553063A, paragraph 0085

Non-patent Document

XILINX Corp. "Virtex-4, Configuration guide"

SUMMARY OF INVENTION

Problems to be solved by the Invention

Patent Documents 1 and 2 disclose an approach to control FPGA through JTAG (IEEE1149.1) in a hardware simulator to read values of memory elements within FPGA. However, JTAG is a standard which utilizes four signals (TCK, TDI, TDO and TMS) to control semiconductor devices including FPGA. Therefore, in order to retrieve values of memory elements from FPGA, it is necessary to determine control information for terminals through complicated calculations to control semiconductor devices based on the control information. This, however, introduces a problem in which it takes a longer time to retrieve values of memory elements from FPGA. This problem becomes more conspicuous in the case of JTAG because semiconductor devices are controlled with fewer signals and the number of controlling terminals is increased.

A typical hardware simulator starts its operation to retrieve values of memory elements at the user's request. For this reason, it takes a long time for the simulator to receive the values from the time of the user's request. As a result, this presents a problem in which debugging of circuits is difficult to perform, for example, values need to be retrieved at each clock cycle, display of waveforms is delayed, etc. Furthermore, it takes a longer time to retrieve a large amount of data stored in memory, making the problem more conspicuous.

Therefore, it is an object of the present invention to provide a semiconductor verification device, method and program which retrieve at high speeds values of memory elements implemented in semiconductor devices and in hardware simulators.

In order to achieve the above object, a semiconductor verification apparatus for verifying a semiconductor device wherein memory elements contained therein are distinguished from one another by a first number and a second number, according to the present invention, comprises:

read means that is implemented within said semiconductor device, and supplies the value of said first number to said semiconductor device to supply the values of first memory elements associated with said first number to the outside of said semiconductor device; a first memory connected with an input terminal of said read means; a second memory that is connected with an output terminal of said read means, and stores the value at the output terminal of said read means at each clock cycle, the value including the values of said first memory elements associated with said first number; initial value information that contains therein values stored in said first memory and that are to be provided to said read means at each clock cycle, based on read means control information that describes a manner to control said read means; initial value calculation means that calculates first position information of said first number within said first memory and second position information of said second number within said second memory based on said read means control information; first number rewrite means that writes said first number alone in said first memory based on said first position information; and retrieval means that determines locations in said second memory at which the values of said memory elements are stored, based on said second number and said second position information, and retrieves the values of memory elements associated with said second number with one retrieval operation.

Since the present invention is configured such that control of an input terminal of the read means necessary for reading values of memory elements is stored in the first memory, and when values of memory elements are retrieved, the read means is controlled only to read values from the first memory, the retrieval operation can be performed at high speeds, thereby attaining the aforementioned object. Furthermore, since the first and second memories are directly connected with the read means, since values output from the read means are stored in the first memory at each clock cycle, and since data at each clock cycle is stored in the second memory, control of the first and second memories is simplified, and data transmission and reception among the read means, the output memory and the input memory is performed at high speeds.

A semiconductor verification method of verifying a semiconductor device whose memory elements are distinguished from one another by first and second numbers, by reading values of said memory elements from said semiconductor device; according to the present invention, comprises: by a read function that is implemented within said semiconductor device, supplying the value of said first number to said semiconductor device to supply the values of memory elements associated with said first number to the outside of said semiconductor device; by said read function, storing in a second memory values including the values of memory elements associated with said second number at each clock cycle; storing values to be provided to said read means as initial value information in a first memory at each clock cycle based on read means control information that describes a method to control said read function; by initial value calculation function, calculating first position information of said first numbers in said first memory and second position information of said second numbers in said second memory; by first number rewrite function, writing said first number alone in said first memory based on said first position information; and by retrieval function, determining locations in said second memory in which the values of memory elements associated with said second number are stored, based on said second number and said second position information, and retrieving the values of memory element associated with said second number from the locations with one retrieval operation.

A semiconductor verification program for verifying a semiconductor device wherein memory elements contained therein are distinguished from one another by a first number and a second number, according to the present invention, comprises: read function that is implemented within said semiconductor device, and supplies the values of said first number to said semiconductor device to supply the values of memory elements associated with said first number to the outside of said semiconductor device; by said read function, storing in a second memory a value at each clock cycle including the values of memory elements associated with said second number; storing in a first memory as initial value information values to be provided to said read means at each clock cycle, based on read means control information that describes a manner to control said read function; initial value calculation function that calculates first position information of said first number within said first memory and second position information of said second number within said second memory; first number rewrite function that writes only said first number in said first memory based on said first position information; and retrieval function that determines locations in said second memory at which the values of memory elements associated with said second number are stored, based on said second number and said second position information, and retrieves the values of memory elements associated with said second number with one retrieval operation.

Further, according to the present invention, a predefined memory is built into the semiconductor verification apparatus as the first memory. However, as the first memory, nonvolatile memory may be detachably arranged in the semiconductor verification apparatus Furthermore, in addition to the second memory, an additional rewritable memory having a capacity greater than or equal to the second memory may be provided. In this case, the additional memory may be configured such that an expected value is previously stored in the additional memory and the difference between the expected data and the data stored in the second memory can be grasped at once.

In addition, a program according to the present invention comprises a row of ordered commands suited for processing by a computer. This program may be stored in a hard disc drive of a computer or semiconductor memories and causes a CPU built in the computer to execute commands. However, this program may be such that it is stored in a recording medium such as CD-ROM, DVD etc. and can be read therefrom as needed.

In the explanation of the exemplary embodiment, the first memory is referred to as an input memory, and the second memory is referred to as an output memory.

Effects of the Invention

A first effect is that values of memory elements which operate in semiconductor devices and hardware simulators can be retrieved at high speeds.

This is because the first memory is directly connected with the read means implemented in the semiconductor device and the read means is controlled by simply reading data stored in the first memory; among the data stored in the first memory, only data that must be changed each time that the retrieval operation is performed is written; the first and second memories are directly connected with the read means; data for each clock cycle are stored in the first memory; and a value output from the read means is stored in the second memory at each clock cycle whereby control of the first and second memories is simplified, and data transmission and reception among the read means, the output memory and the input memory is performed at high speeds.

FIG. 2 is a view illustrating memory elements and associated number information in the present exemplary embodiment.

FIG. 3 is a view illustrating the specific examples of a command and its bit pattern in the present exemplary embodiment.

Figure 4:
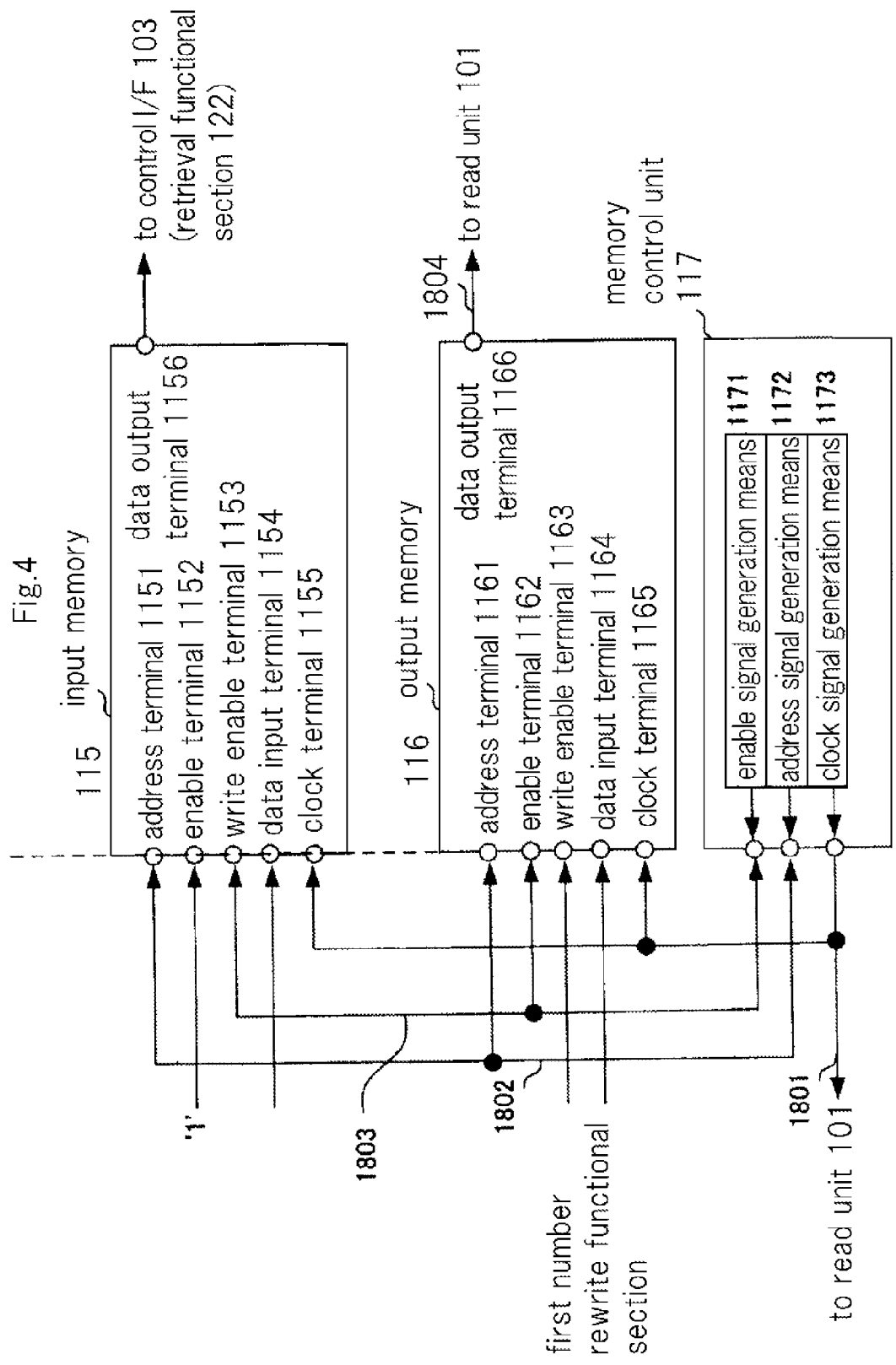

FIG. 4 is a view illustrating control of output memory 115 and input memory 116 through memory control unit 117.

Figure 5:
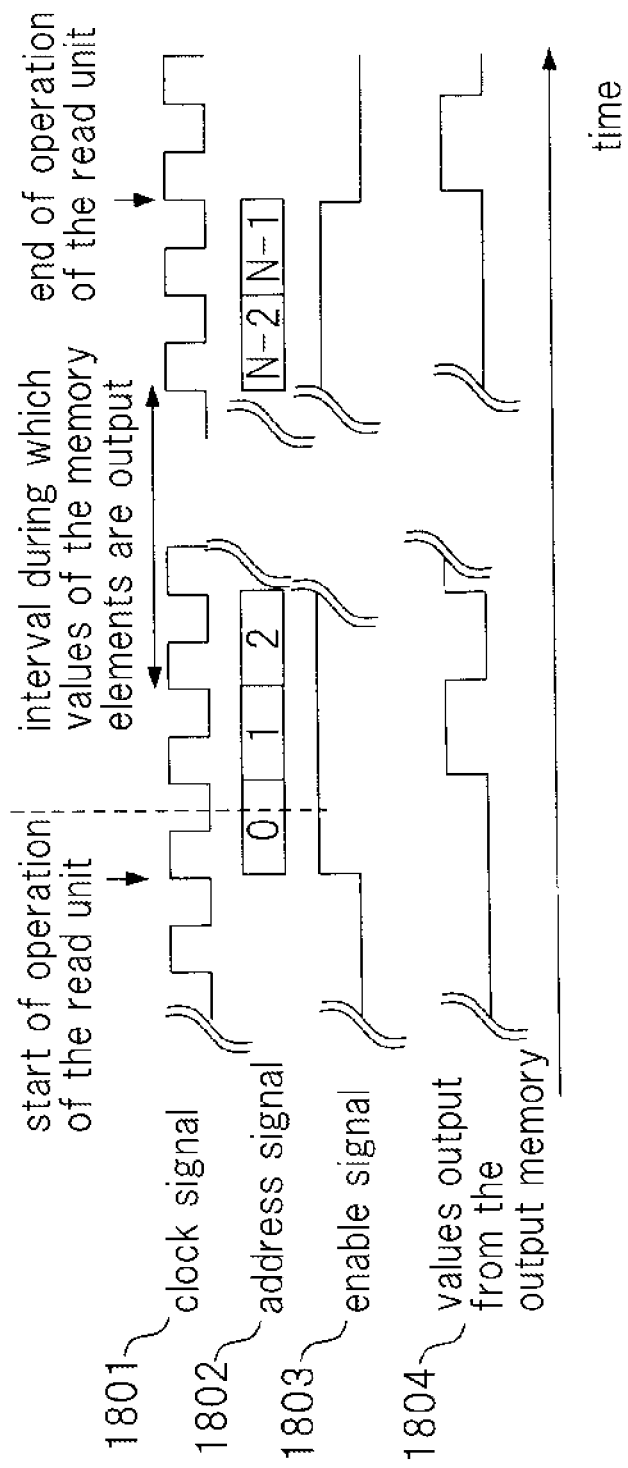

FIG. 5 is a wave chart of a clock signal, an address signal and etc.

Figure 6:
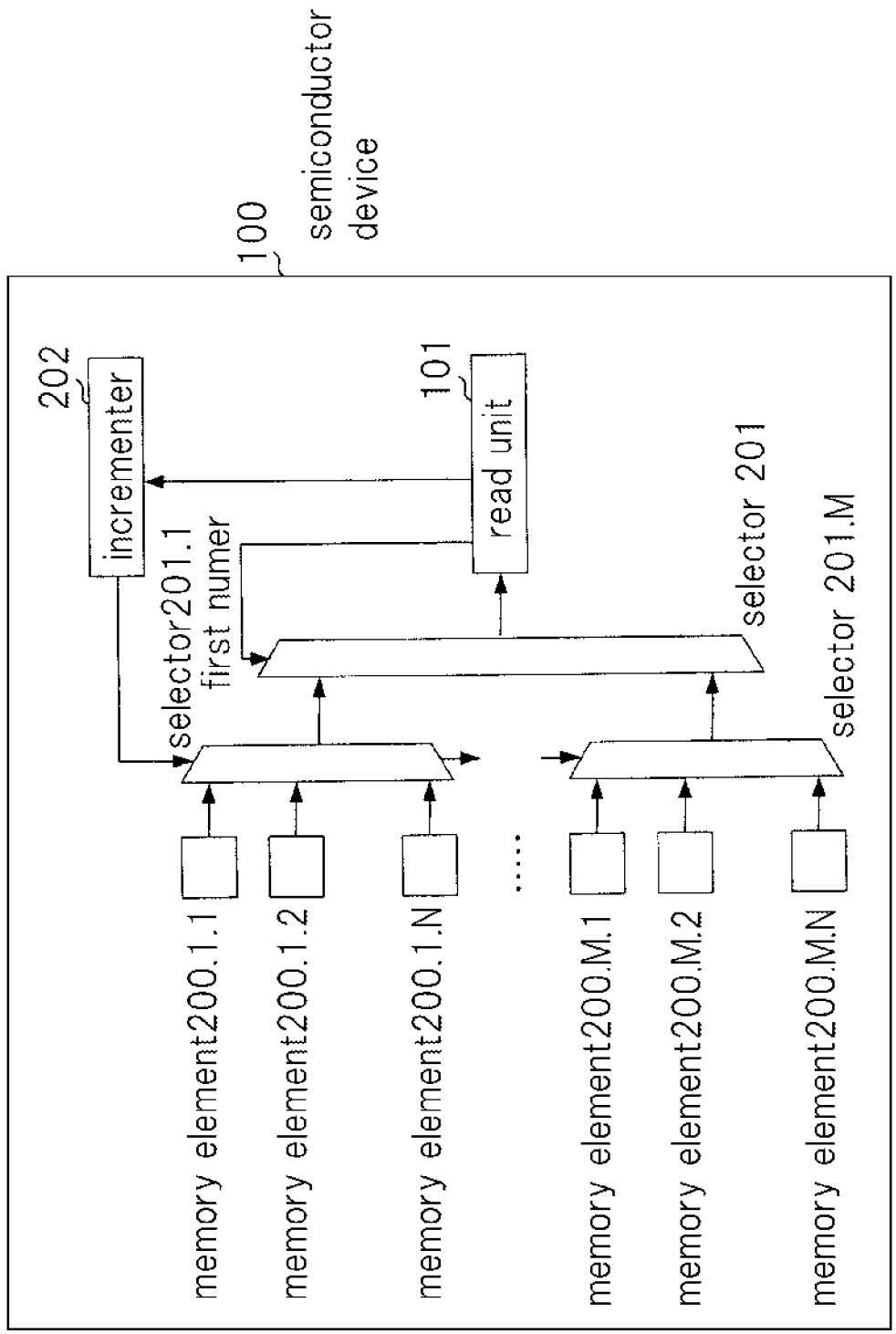

FIG. 6 is a block diagram of a semiconductor device which constitutes the first exemplar embodiment.

Figure 7:
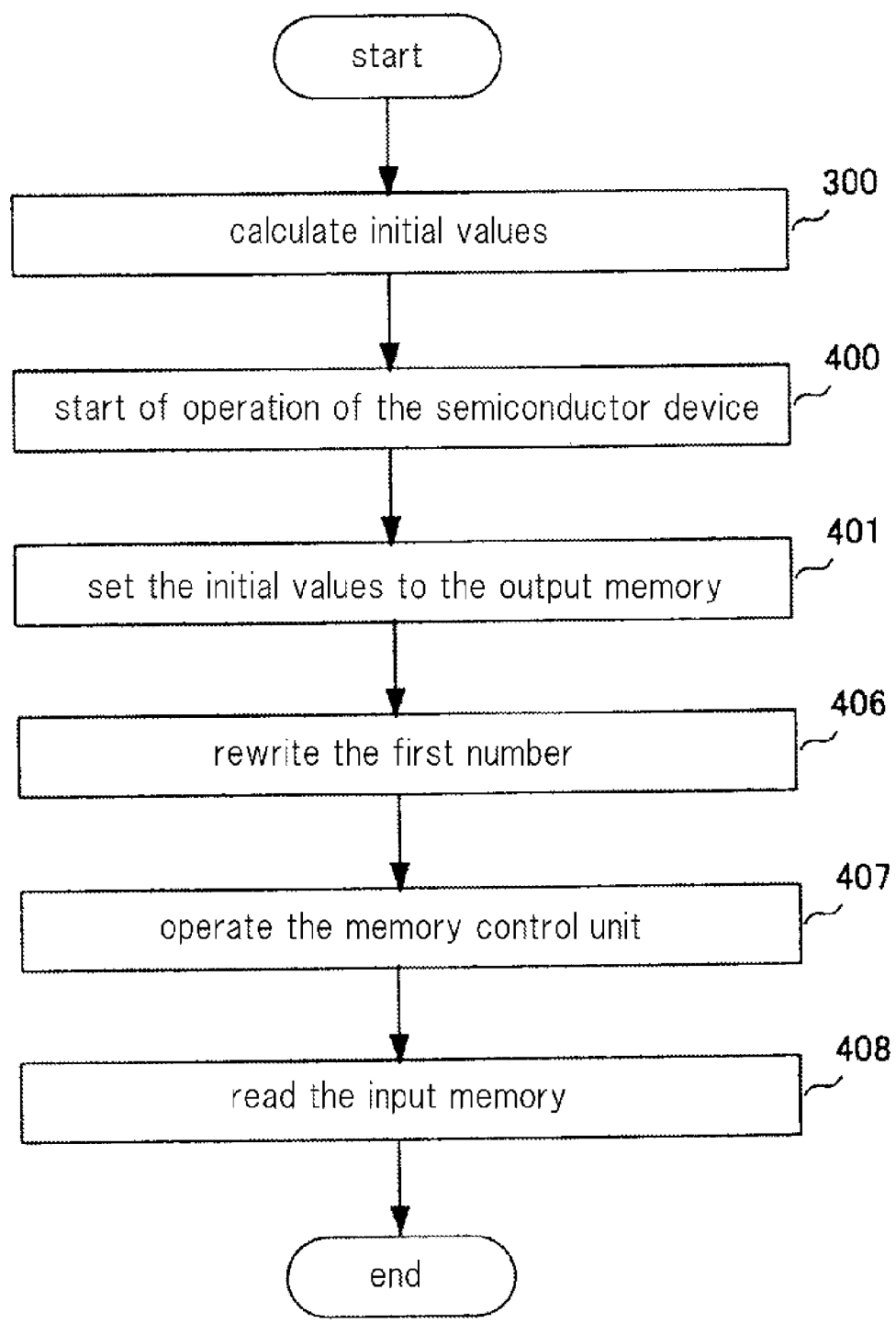

FIG. 7 is a flow chart illustrating the operation of the first exemplary embodiment.

Figure 8:
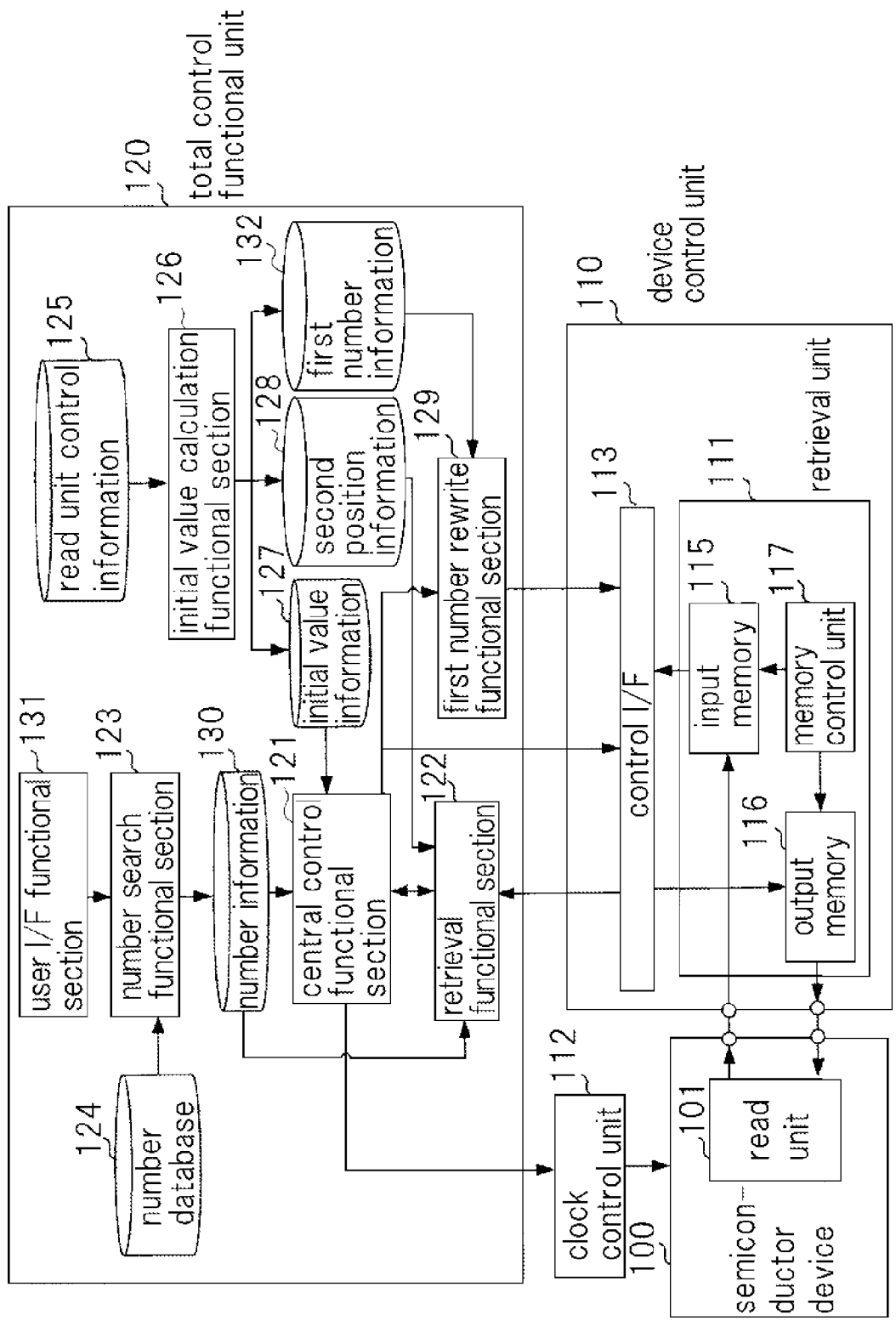

FIG. 8 is a block diagram illustrating the configuration of a second exemplary embodiment according to the present invention.

FIG. 9 is a part of Logic Location File which is an excerpt of data concerning number database 124 and which is provided by XILINX corp., in which the third, fourth and seventh columns represent the first number (Frame Address), the second number (Frame Offset) a name of a memory element, respectively.

Figure 10:
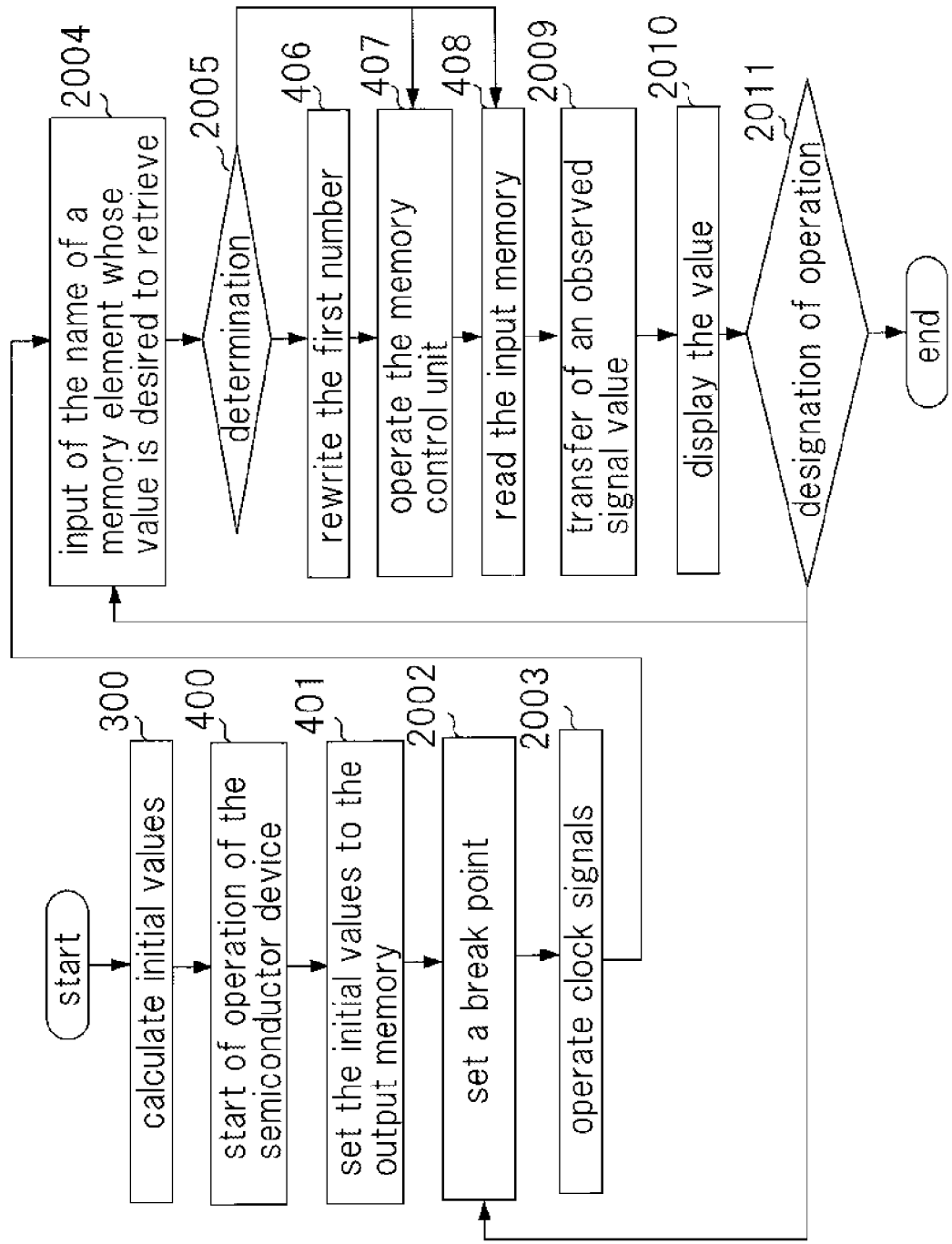

FIG. 10 is a flow chart illustrating the operation of the second exemplary embodiment.

Figure 11:
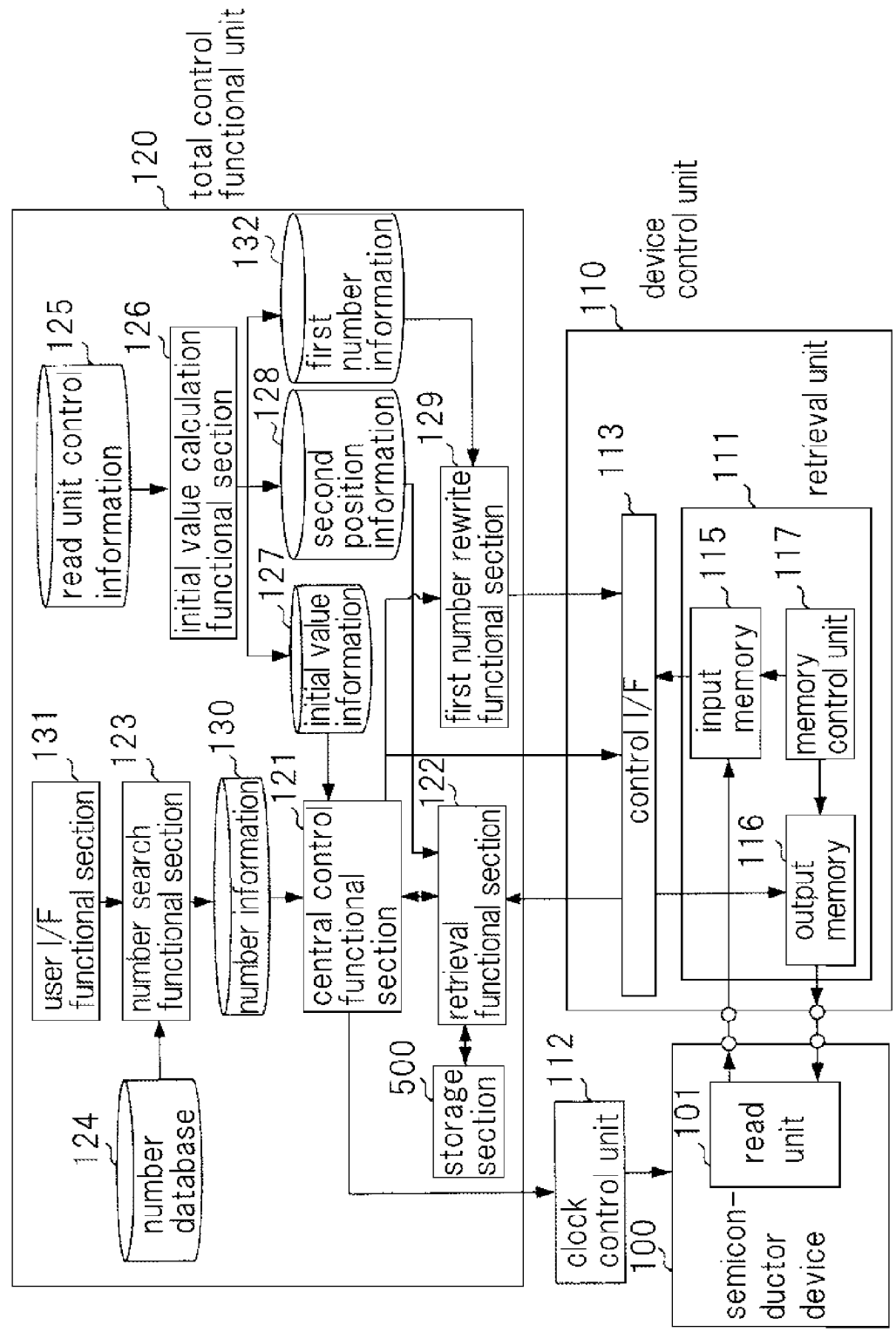

FIG. 11 is a block diagram illustrating the configuration of a fourth exemplary embodiment according to the present invention.

Figure 12:
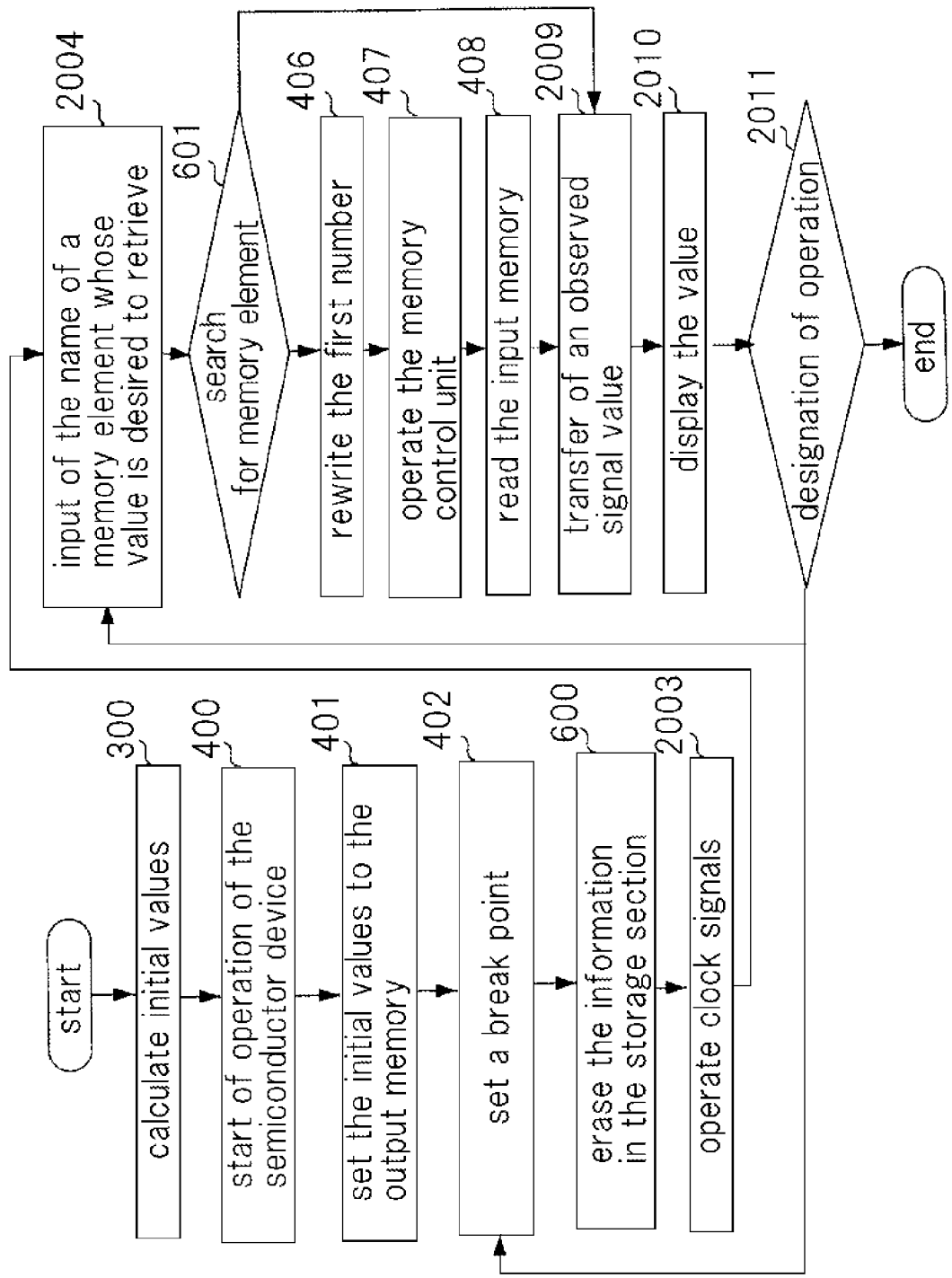
Figure 13:
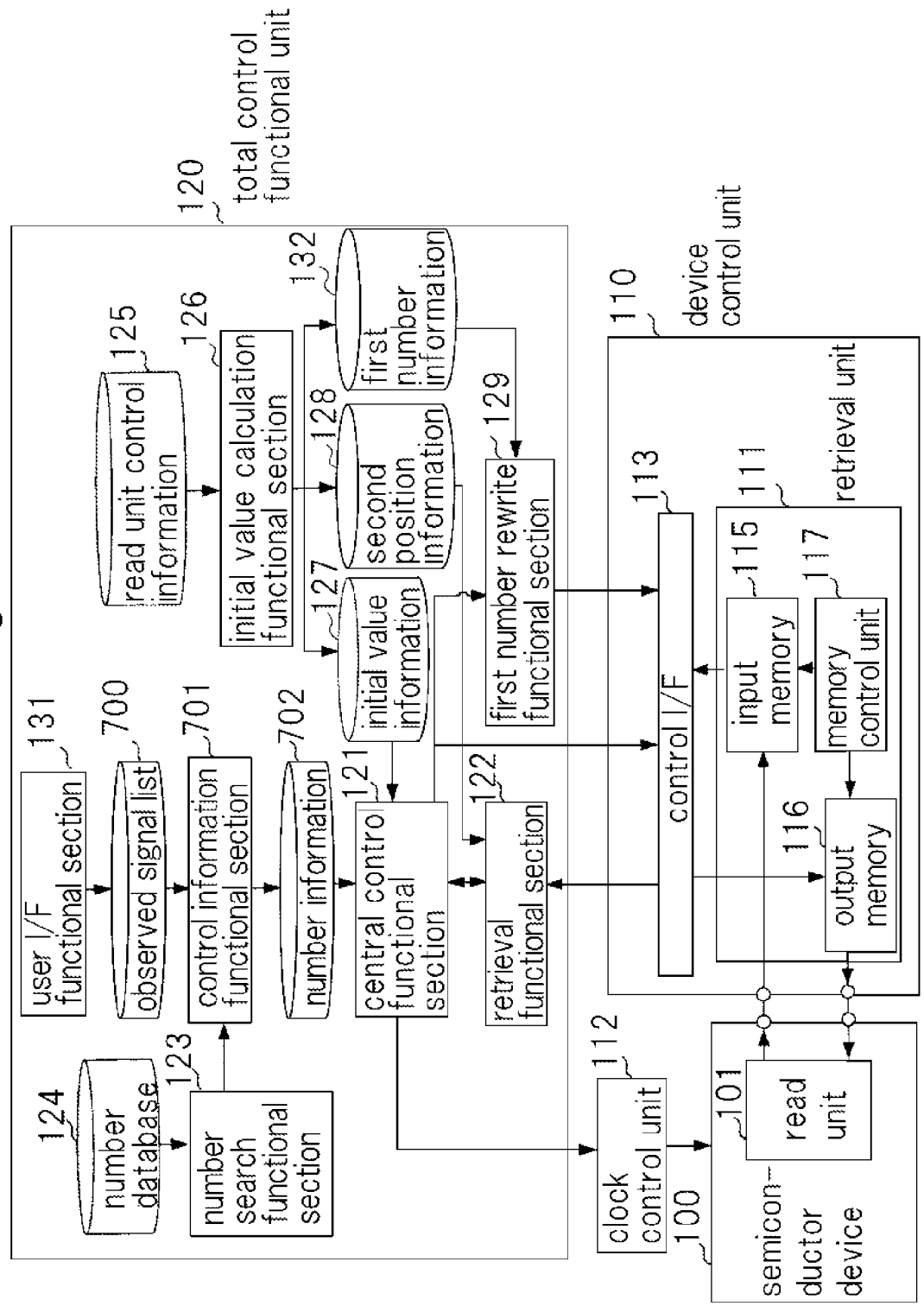

FIG. 12 is a flow chart illustrating the operation of the fourth exemplary embodiment FIG. 13 is a block diagram illustrating the configuration of a fifth exemplary embodiment according to the present invention.

FIG. 14 is a view illustrating an observed signal list and the first and second number in the fifth exemplary embodiment.

Figure 15:
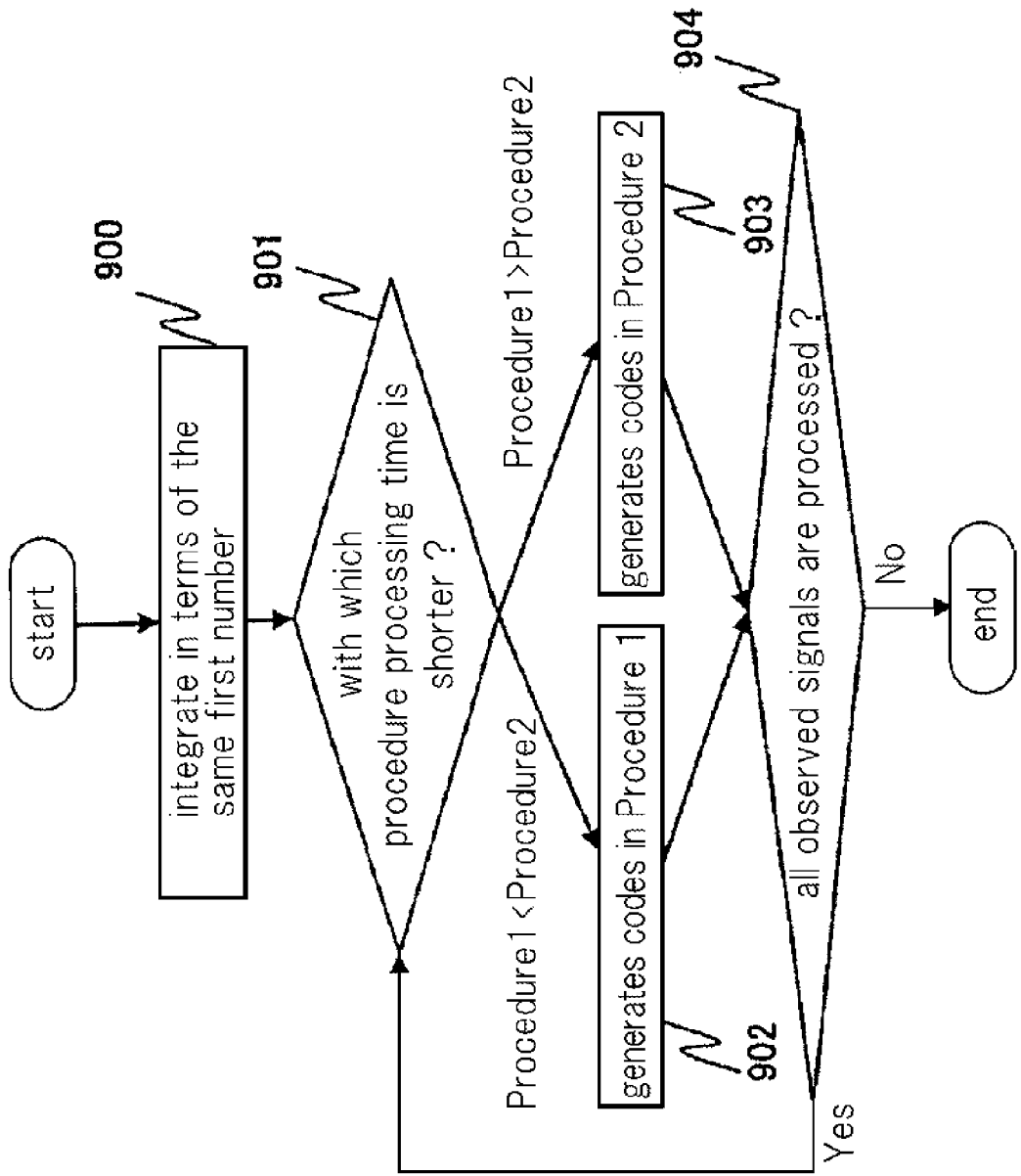

FIG. 15 is a flowchart illustrating the operation of a control information calculation function in the fifth exemplary embodiment.

FIG. 16 is a view illustrating the result (control information) which is obtained by applying the procedure shown in the flowchart of FIG. 15 to the observed signal list shown in FIG. 14 in the fifth exemplary embodiment.

Figure 17:
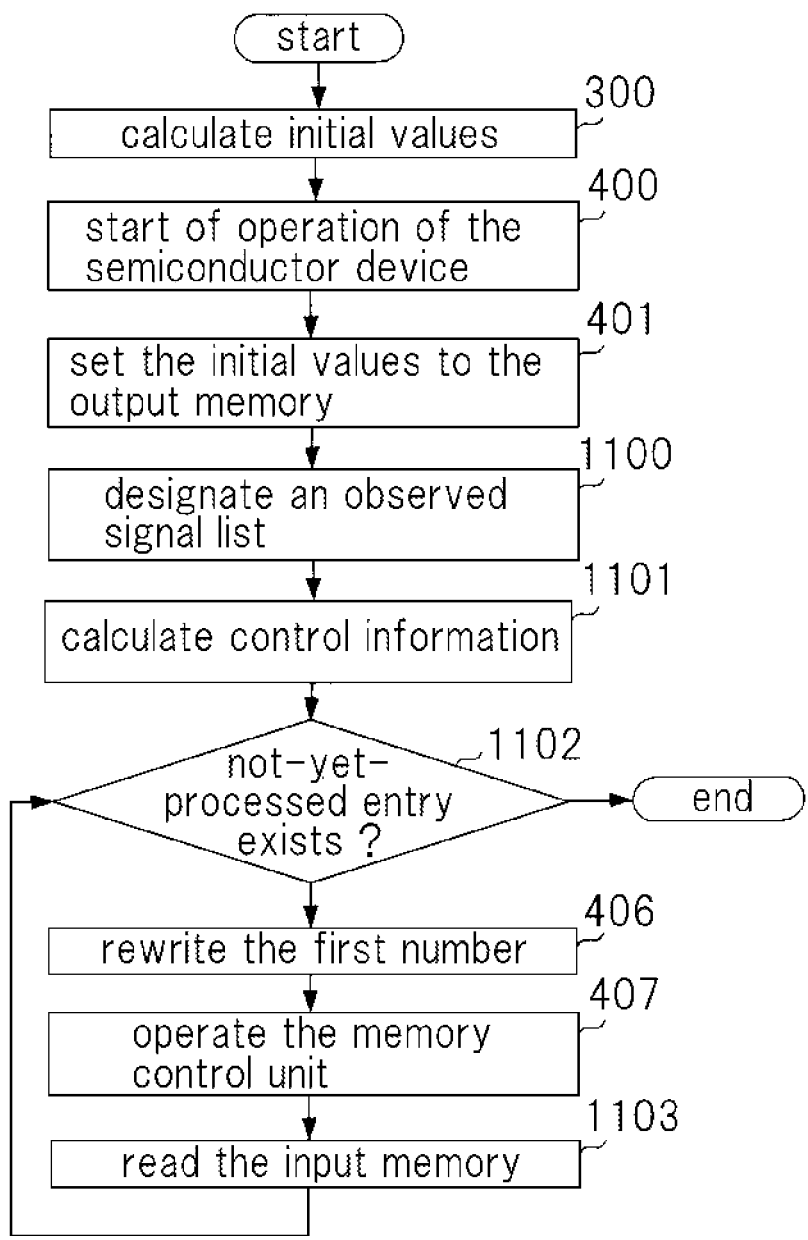
Figure 18:
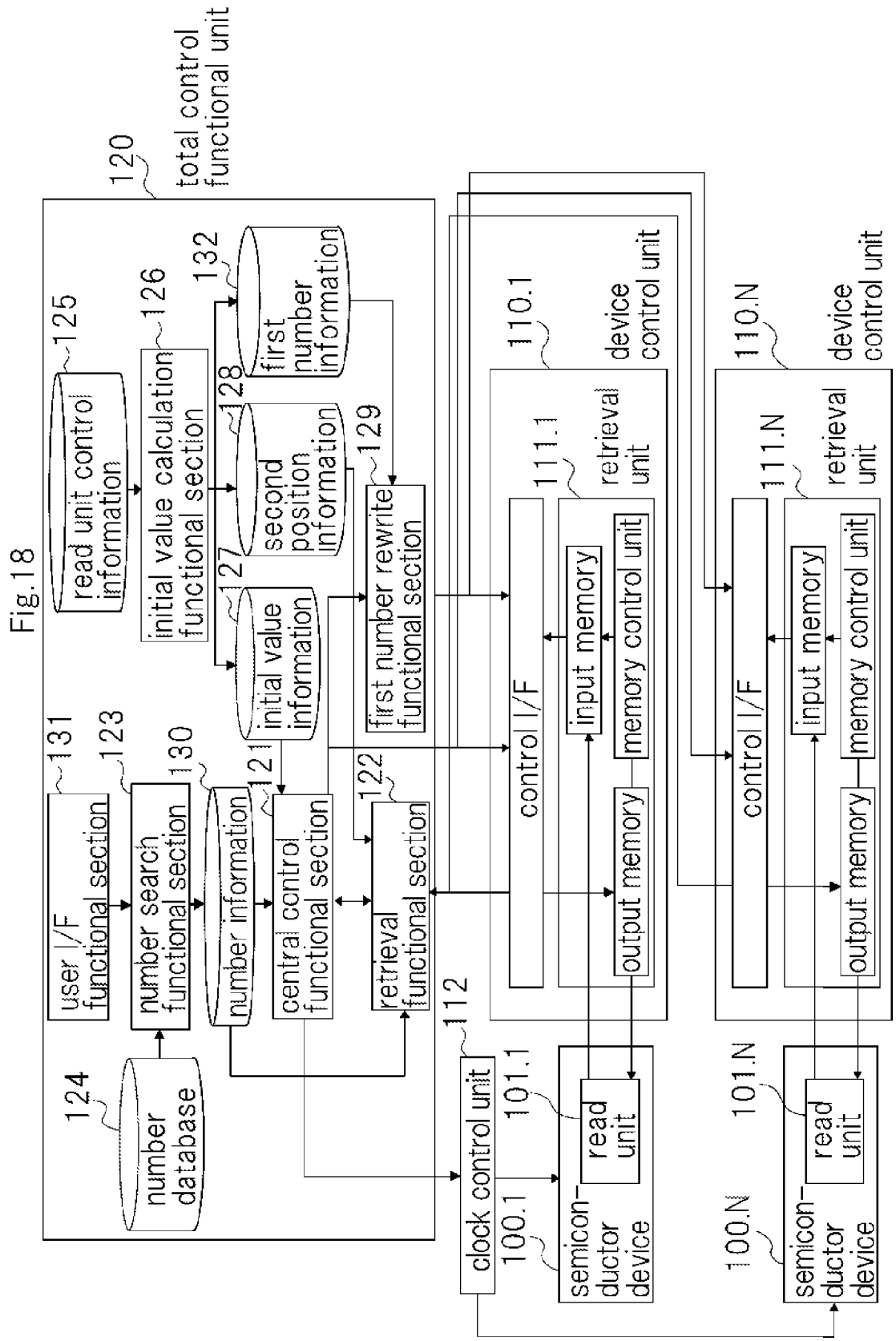

FIG. 17 is a flow chart illustrating the configuration of the fifth exemplary embodiment FIG. 18 is a block diagram illustrating the configuration of a sixth exemplary embodiment according to the present invention.

Figure 19:
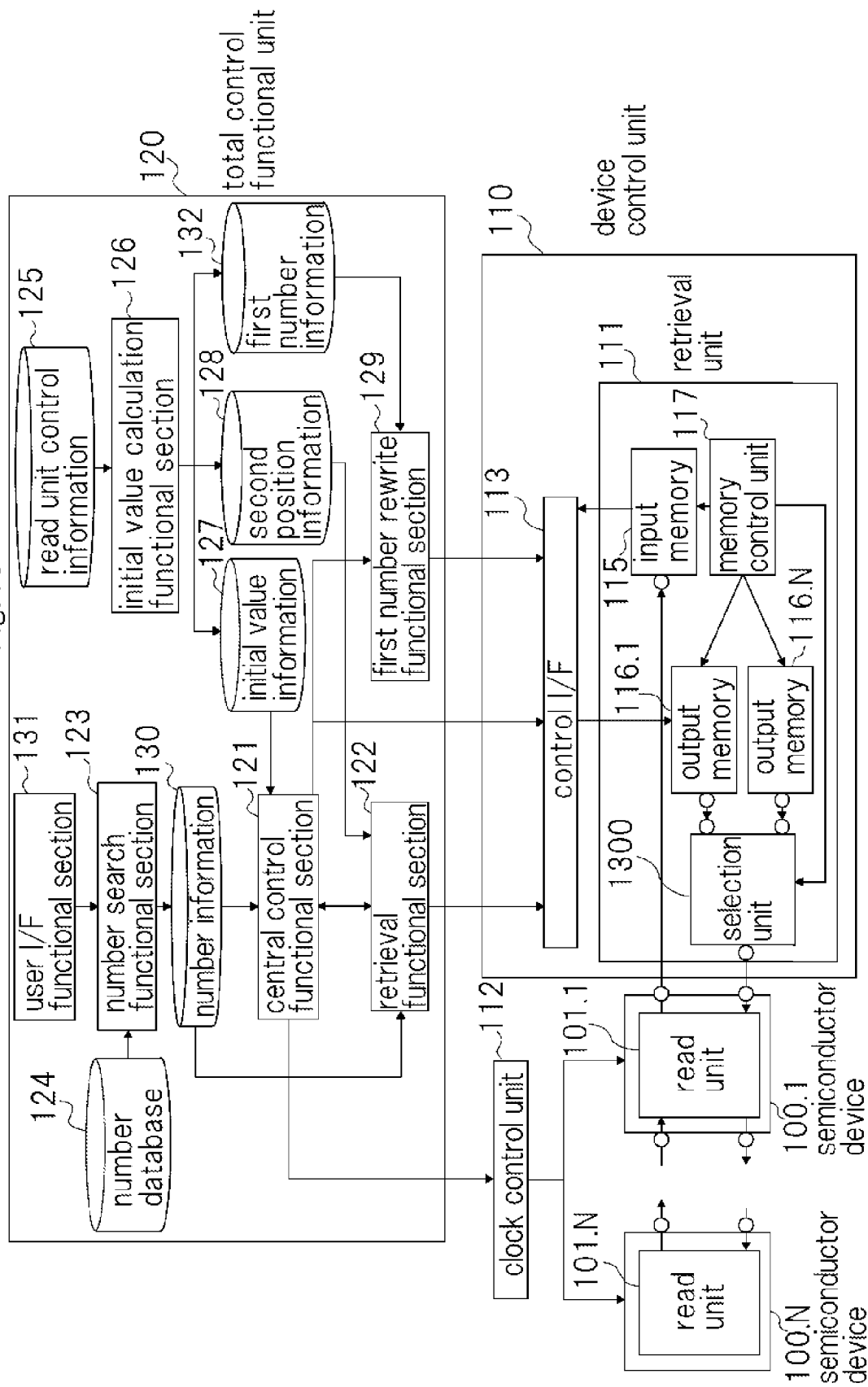

FIG. 19 is a block diagram illustrating the configuration of a seventh exemplary embodiment according to the present invention.

Figure 20:
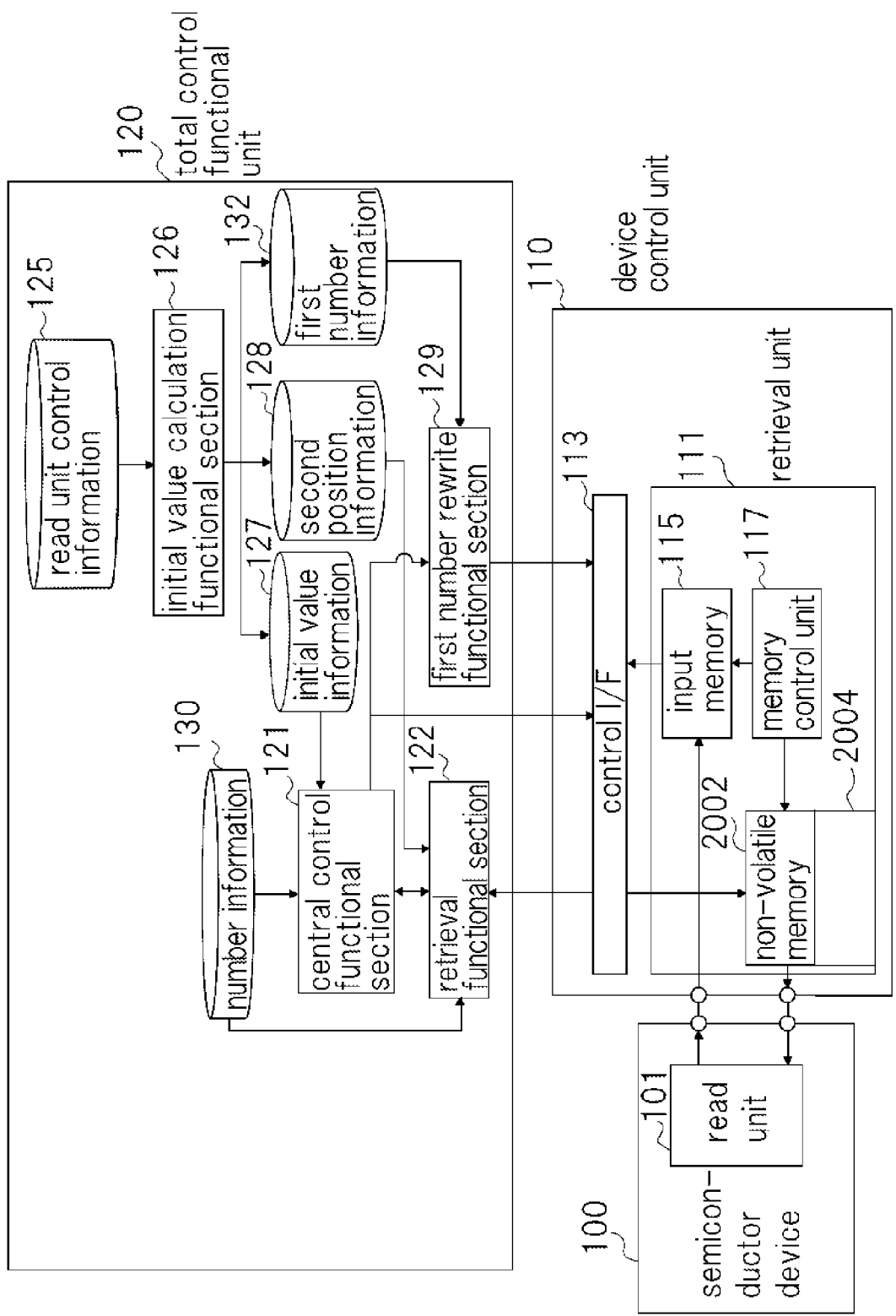

FIG. 20 is a block diagram illustrating the configuration of a eighth exemplary embodiment according to the present invention.

Figure 21:
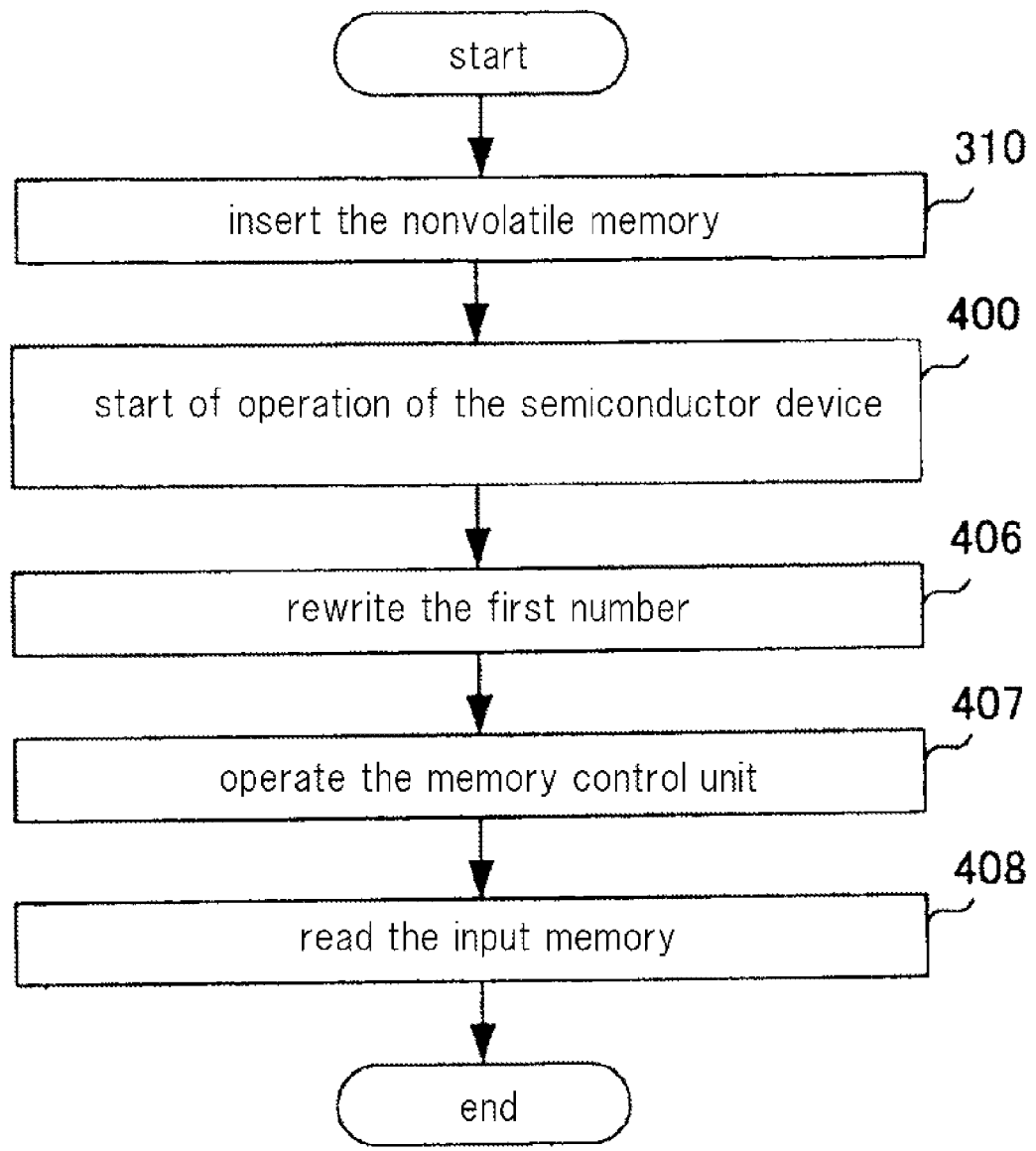
Figure 22:
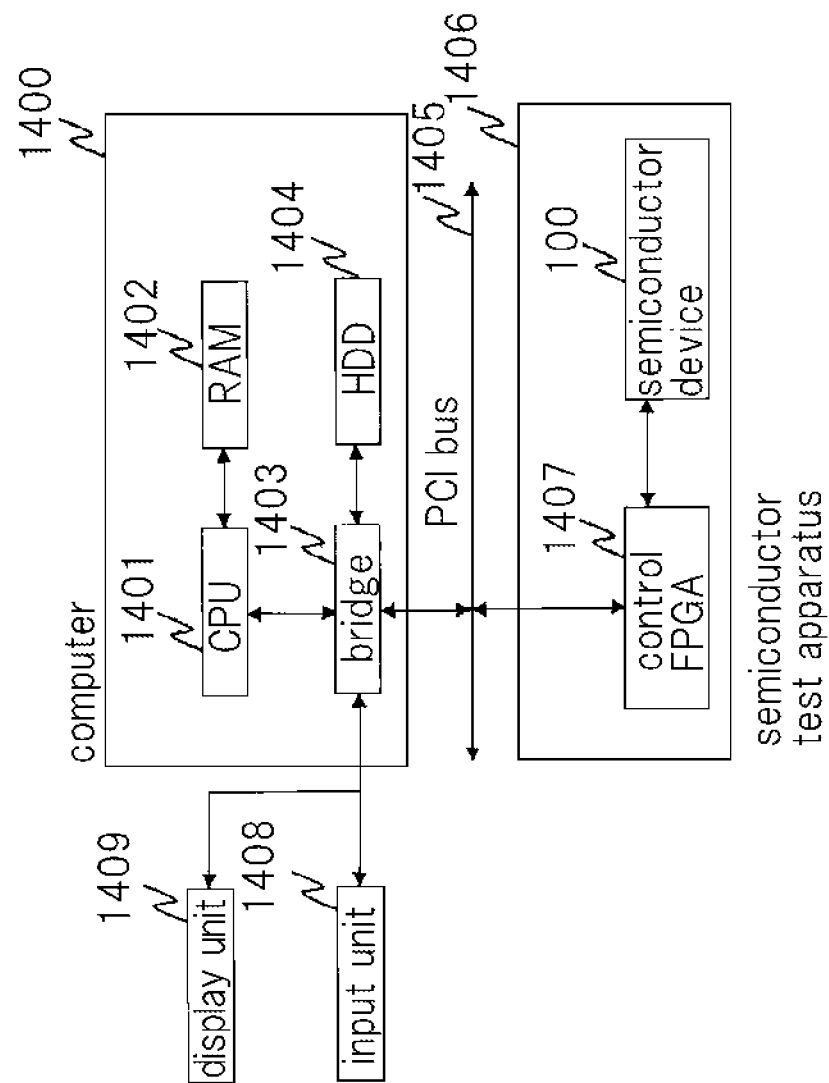

FIG. 21 is a flow chart illustrating the operation of the eighth exemplary embodiment FIG. 22 is a block diagram illustrating the configurations of a computer and a semiconductor test device.

BEST MODE FOR CARRYING OUT THE INVENTION

Best modes for carrying out the invention will now be described in detail with reference to the drawings.

Figure 1:
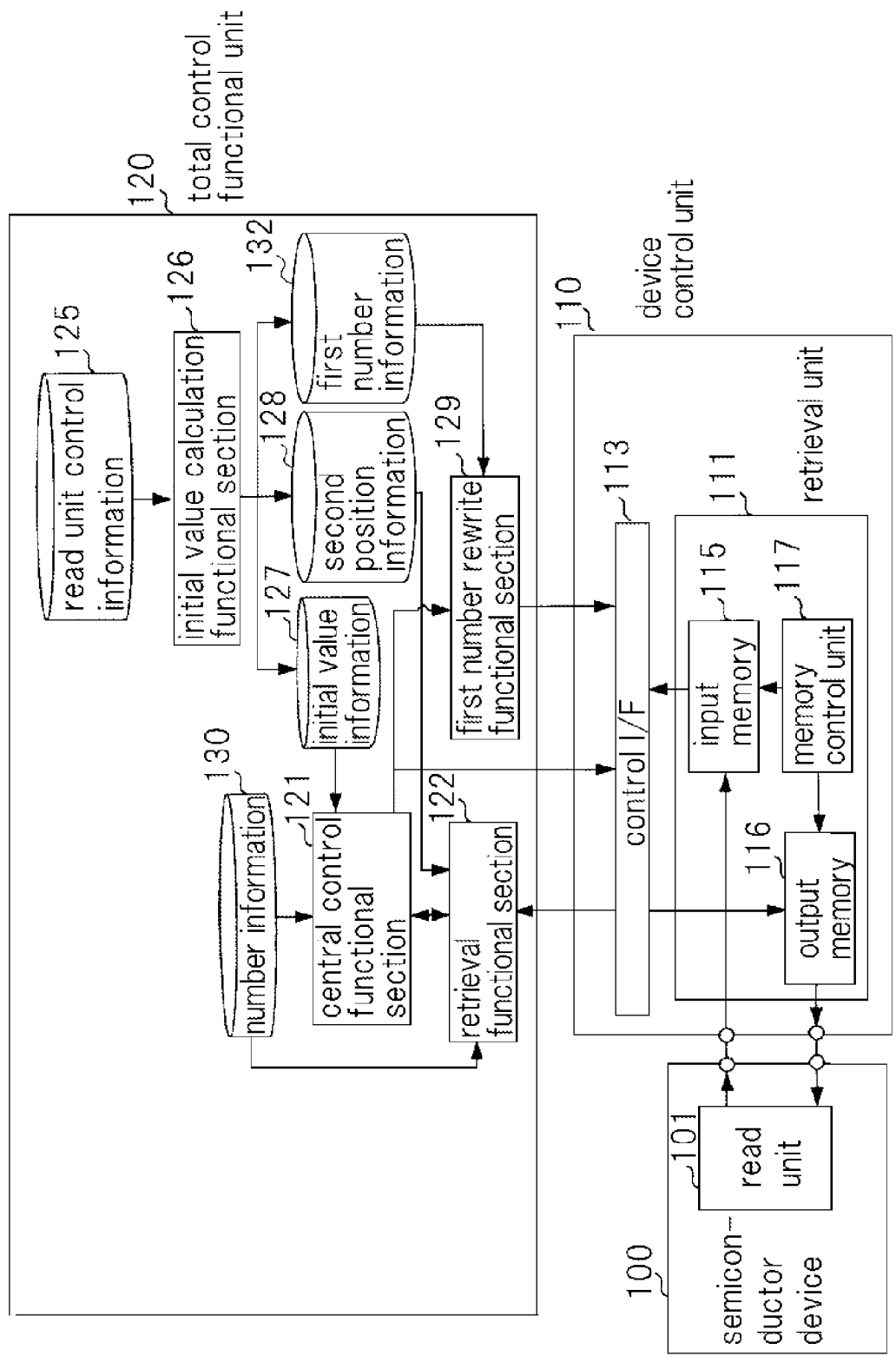
FIG. 1 is a block diagram illustrating the configuration of a first exemplary embodiment according to the present invention.

Referring to FIG. 1, a first exemplary embodiment according to the present invention comprises semiconductor device 100, device control unit 110 for controlling read unit 101 in semiconductor device 100, and total control functional unit 120 for controlling device control unit 110.

Semiconductor device 100 includes memory elements (later described by way of example in FIG. 2) which can be uniquely identified by the combination of a first number and a second number, and read unit 101 which accesses the memory elements based on the first number and read unit control information 125 to read all the memory elements associated with the first number. These memory elements are flip flops, latches, memories, registers, etc.

Concrete descriptions will now be given of the first and second numbers and read unit control information 125.

The first and second numbers are allocated to memory elements within semiconductor device 100, and there is a one-to-one correspondence between the combination of the first and second numbers and each memory element. Total control functional unit 120 controls read unit 100 through the terminals of the device control unit based on the first number and read unit control information 125. As a result, values of a memory element associated with the first number are output from read unit 101 to device control unit 110. For example, when a number is allocated to each memory element, as shown in FIG. 2, the values of memory elements A and D are output from the output terminals of read unit 101 by controlling read unit 101 based on the first number 0x1024 and read unit control information 125.

Read unit control information 125 is control information necessary for controlling read unit 101 to read the value of a desired memory element. Specific examples thereof are shown in FIG. 3. In the examples in FIG. 3, operation of semiconductor device 100 is halted through a first "device halt command", the first number is provided to read unit 101 through the next "first number read command", values of memory element associated with the first number specified by the first number read command is retrieved from read unit 101 through the next "read command" (at this time, input memory 115 of the present exemplary embodiment stores the value at the output terminal of the read unit at each clock cycle), and semiconductor device 100 is turned back to a state in which it can be operated, through "device start command "to retrieve the value of a desired memory element. A more specific example in the case of FPGA of XILINX Corp. by Non-patent document 1 describes specifics of read unit control information 125 on Table 8-5 in Chapter 8.

Device control unit 110 includes retrieval unit 111 which controls read unit 101, and control interface (I/F) 113 which retrieves the content of input memory 116 (second memory), rewrites the content of output memory 116 (first memory), and transfers instructions from total control functional unit 120 to memory control unit 117. Retrieval unit 111 in turn includes: input memory 115 whose data input terminal is directly connected to the output terminal of read unit 101 and which stores the value at the output terminal at each clock cycle; output memory 116 whose data output terminal is directly connected to the input terminal of read unit 101, and which stores a value (initial value information 127, as later described) to be given to the output terminal at each clock cycle; and memory control unit 117 which controls address terminal 1151, enable terminal 1152, and write enable terminal 1153 of input memory 115 to perform a control to store the value at the output terminal of read unit 101 in input memory 115, and which controls address terminal 1161 and enable terminal 1162 of output memory 116 to properly supply the value of output memory 116 to read unit 101.

Operation of memory control unit 117 will be described in detail using FIGS. 4 and 5. FIG. 4 illustrates a more specific example of retrieval unit 111. In this circuit example, control of address terminal 1161 and enable signal 1162 when the content of output memory 116 is rewritten through initial value information 127 and first number rewrite functional unit 129, and control of address terminal 1161 and enable terminal 1162 when retrieval functional unit 122 reads a value, are omitted. However, even when memory control unit 117 performs these controls, if they are appropriately done, implementation of these functions is easy.

In FIG. 4, memory control unit 117 controls address terminal 1151 and write enable terminal 1153 of input memory 115, and also controls address terminal 1161 and enable terminal 1162 of input memory 116 in the manner shown in FIG. 5. In FIG. 5, clock signal 1801 is a signal which is supplied to read unit 101, input memory 115 and output memory 116 so that these units may operate in synchronism with one another. Address signal 1802 is an address signal which is supplied to address terminal 1151 of input memory 115 and to address terminal 1161 of output memory 116. In this example, the identical signal is supplied to address terminal 1151 of input memory 115 and to address terminal 1161 of output memory 116. However, separate signals may be supplied to these terminals if they do not lower the operational speed of the circuits. Enable signal 1803 is a common signal which is supplied to enable terminal 1162 of output memory 116 and to write enable terminal 1152 of input memory 115. Instead of this signal, separate signals may also be supplied to these terminals if they do not lower the operational speed of the circuits. Signal 1804 illustrates by way of example a signal which is output from the data output terminal of output memory 116. This signal is supplied to read unit 101 which in turn operates based on the first number contained in this signal. As a result, values of memory elements which are present within the semiconductor device are output.

In this example, memory control unit 117 supplies the clock signal to input memory 115, output memory 116 and read unit 101. However, this is an example, and the clock signal may be supplied from the outside, or may be supplied at plural cycles, not at each one cycle as shown in FIG. 5. Further, in this example, the values of memory elements are output while supplying data from output memory 116 to read unit 101. However, the values of memory elements may be output after supplying all data from output memory 116 to read unit 101. Furthermore, in this example, data is supplied to read unit 101 while incrementing an address from a lower address. However, conversely, data may be read in order from a higher address, and a method of generating addresses higher than incrementing addresses, if any, may be utilized. Still further, in this example, waveforms are depicted in a positive logic. However, signals may exist that operate in a negative logic on a circuit.

By configuring memory control unit 117 in the manner described above, a high-speed retrieving operation can be achieved even when device control unit 110 is implemented with FPGA which exhibits a lower operational speed as compared with semiconductor devices such as custom LSI, etc. Further, when there exist plural input terminals and plural output terminals in read unit 101, an input memory or an output memory may be provided for each one terminal. This arrangement ensures coincidence of the bit width of the memory with the bit width of the terminal of the read unit, thus making it possible to eliminate wasted memory. Furthermore, since this arrangement can obviate the circuit for the conversion of bit positions, etc., read unit 101 and retrieval unit 111 can be operated at high speed, and hence the value of a desired memory element can be retrieved in a short period of time. The same can be realized by utilizing a memory having a bit width not less than the bit width of its terminal and by fixing the bit position of the memory corresponding to the terminal.

Total control functional unit 120 comprises: number information 130 which contains the first and second numbers related to a desired memory element in the present exemplary embodiment; initial value calculation functional section 126 which, based on read unit control information 125, calculates initial value information 127 which is the value of output memory 116, first position information 132 which contains the position of the first number in output memory 116, and second position information 128 which indicates the position in input memory 115 at which the value of a memory element having each second number is stored (if the second numbers are the same irrespective of the first number, the positions in input memory 115 at which the values are stored are assumed to be the same); first number rewrite functional section 129 which rewrites, based on first position information 132 and the first number contained in number information 130, the relevant portion alone of output memory 116; retrieval functional section 122 that retrieves from input memory 115, based on second position information 128, only the portion of input memory 115 associated with the second number; and central control functional section 121 which performs a control to retrieve, from number information 130, the values of memory elements associated with the numbers in number information 130.

A more specific explanation will be herein given of initial value calculation functional section 126, initial value information 127, first position information 132, second position information 128, first number rewrite functional section 129 and retrieval functional section 122 with reference to FIG. 3.

Initial value calculation functional section 126 performs calculations based on the configurations of input memory 115 and output memory 116, read unit control information 125 and the connection mode of the device (JTAG etc). Specifically, initial value calculation functional section 126 calculates initial value information 127 which is the content of output memory 116, first position information 132 indicative of the bit position of the first number in output memory 116; and second position information 128 which is a list of the second number and the position of input memory 115. For example, assume that the first number is of a 32-bit configuration, each command is of a 12-bit configuration (the first number command is of a 44-bit configuration [12 bits of command plus 32 bits of the first number]), and each command has a bit pattern shown in FIG. 3. As initial value information 127 (the initial value of output memory 116), 0x300_005_XXXXXXXX_001_301 is stored, where X has an arbitrary value because X is the first number which is rewritten upon each operation, and the data input direction is supposed to be MSB First. As first position information 132, the start position is stored in $24^{th}$ bit, and the end position is stored in $56^{th}$ bit. Based on read unit control information 125 and the configuration of input memory 115 and/or memory control unit 117, initial value calculation functional section 126 further calculates second position information 128 which is a list includes addresses such as address 0x3 of the input memory when the second number is 0, and address 0x4 of the input memory when the second number is 1. When semiconductor devices 100 are connected through JTAG, two signals TD1 and TMS must be controlled to supply an appropriate value to read unit 101 at an appropriate state. Further, the method of calculation also differs according to the connection mode of the devices, calculations of initial value information 127, first position information 132 and second position information 128 are complicated. For this reason, in the present exemplary embodiment, in order to operate read unit 101, initial value information 127, which does not correspond to the first number, is calculated and is previously stored in output memory 116 whereby the above complicated calculations that need to be performed each time the retrieval operation is carried out is obviated to thereby speed up the retrieval operation.

First number rewrite functional section 129 rewrites a position (the portion XXXXXXXX in the above example, data from $24^{th}$ bit to $56^{th}$ bit) that corresponds to the first number in output memory 116 and that is described in first position information 132, with the first number in number information 130. For example, when output memory 116 is implemented as one port memory of 32 bits, first number rewrite functional section 129 operates to rewrite data of $24^{th}$ bit to $32^{th}$ bit of output memory 116 at a first time, rewrite data of $33^{th}$ bit to $56^{th}$ bit of output memory 116 at a second time, thereby rewriting values a smallest number of times. At this time, by appropriately changing an address output from memory control unit 117 and a start position to store initial value information 127, locations in output memory 116 at which the firs numbers are stored may be rewritten with one rewrite operation to output memory 116. For example, in the above example, by storing initial value information 127 from address 8 and by starting operation of memory control unit 117 from address 8, a portion in output memory 116 associated with the first number is $33^{th}$ bit to $64^{th}$ bit. Therefore, locations in output memory 116 at which the first numbers are stored can all be rewritten with one rewrite operation, making it possible to perform the retrieval operation at high-speeds. When a dual port memory can be utilized as output memory 116, reading data of output memory 116 and rewriting the first number can be performed concurrently with each other. Therefore, the rewrite time of first number rewrite functional section 129 can be apparently zero, making it possible to perform the retrieval operation at high speeds.

Retrieval functional section 122 determines the position of a desired memory element in input memory 115 from the second number contained in number information 130 and second position information 128, and retrieves the value of the desired memory element from the position with a single retrieve operation. For example, when a dual port memory can be utilized as input memory 115, if the data width of input memory 115 at control I/F 113 side is matched with the data width of control I/F 113 in order to speed up (improve) the data transfer rate between total control functional section 120 and device control unit 110, input memory 115 can be read more quickly. For example, when control I/F 113 is a PCI bus having a 32-bit width, by making the data width of input memory 115 at control I/F 113 side 32 bits, efficient data transfer is possible between total control functional unit 120 and device control unit 110 (this is most efficient in the fourth exemplary embodiment). Next, operations of semiconductor device 100, read unit 101, control I/F 113 and central control functional section 121 will be described.

Semiconductor device 100 is a device (apparatus, component) which operates in accordance with a clock signal supplied from the outside. Semiconductor device 100 includes a read unit which is capable of reading values of signals in semiconductor device 100. However, in the present exemplary embodiment, since values of memory elements can only be read, the way to read is not defined. For example, as shown in FIG. 6, selectors 201, 201.1, . . . , 201.N are provided for memory elements 200.1.1~200.1.N, . . . , 200.1.1~200.M.N, respectively. When values of memory elements 200.X.1~200.X.N associated with the first number X are read, read unit 101 first sets the value of incrementer 202 to 1, and controls selector 201.S (where S equals to 1 to M) such that it outputs the value of memory unit 201.S. Next, read unit 101 provides the first number to selector 201 and controls selector 201 such that it outputs the output of selector 201.X to read unit 101. Next, read unit 101 increases incrementer 202 to 2 to be able to read the value of memory element 200.X.2. By repeating the above operation until incrementer 202 is N, values of memory elements 200.X.1 to 200.X.N are supplied to read unit 101 which in turn provides the values to its output terminals.

Control I/F 113 has a function to control retrieval unit 111 in response to a command from total control unit 120. For example, when total control unit 120 is implemented with a general computer having a CPU or CPUs, control I/F 113 is an I/F for connection to the computer, to be concrete, an I/F which can perform data exchange with a PCI bus, a PCI express bus, a USB.IEEE1394, Ethernet™, and etc.

Central control functional section 121 has a function to control the entire system. First, central control unit 121 stores the value of initial value information 127 in output memory 116 after semiconductor device 100 is activated. At this time, any value may be written to a location associated with the first number because the value is written each time memory elements are read.

When semiconductor device 100 has stopped its operation, central control functional section 121 rewrites output memory 116 with the first number contained in number information 130 using first number rewrite functional section 129. Subsequently, central control functional section 121 controls output memory 116 and input memory 115 via memory control unit 117, which in turn supplies to read unit 101 data for reading a value of a desired memory element therefrom, and stores the value of a desired memory element output from read unit 101 in input memory 115. Thereafter, central control functional section 121 retrieves the value of a desired memory element from input memory 115 through retrieval functional section 122.

In general, device control unit 110 is implemented in hardware for high-speed operation, and total control functional section 120 is implemented as a program that runs on a general computer, but is not limited thereto.

Next, a description will be given of overall operation of the present exemplary embodiment in detail with reference to the flowcharts shown in FIGS. 1 and 7.

First, at step 300 in FIG. 7, initial value calculation functional section 126 calculates, from read unit control information 125, initial value information 127 which is the content of output memory 116, and also calculates first position information 132 indicative of the position of the first number in output memory 116 and second position information 128 which is a list of information of positions in input memory 115 which stores the value of a desired memory element for each second number.

At step 400, semiconductor device 100 is powered on to be operable. When semiconductor device 100 is constructed as FPGA, configuration of FPGA is also performed at step 400.

Subsequently, at step 401 in FIG. 7, the content of initial value information 127 is set to output memory 116. In this step, central control functional section 121 reads initial value information 127, and writes its data to output memory 116. When output memory 116 is a memory capable of having initial values built-in, initial value information 127 can be previously incorporated in output memory 116 when constituting the latter. In this case, step 401 may be dispensed with.

Furthermore, at step 406 in FIG. 7, central control functional section 121 controls first number rewrite functional section 129 to rewrite the first number contained in number information 130 to the pertinent location in output memory 116 (which is included in first position information 132 calculated at step 300).

Next, at step 407 in FIG. 7, central control functional section 121 causes memory control unit 117 to operate, so that values stored in output memory 116 are supplied to read unit 101 and a value(s) of a desired memory element(s) output from read unit 101 is/are stored in input memory 115.

Subsequently, at step 408 in FIG. 7, central control functional section 121 controls retrieval functional section 122 to retrieve a value(s) of a desired memory element(s) in input memory 115 based on the second number contained in number information 130 and on second position information 128

The effects provided by the present exemplary embodiment will be described below.

The present exemplary embodiment is configured such that control of the input terminals read unit 101 necessary for reading values of desired memory elements is previously stored in output memory 116, and when values of desired memory elements are actually retrieved, read unit 101 operates only to read values from output memory 116 after rewriting different portions alone of the memory elements (the first number in the present exemplary embodiment). Therefore, the present exemplary embodiment provides the advantage of high-speed retrieval operation.

Further, in the present exemplary embodiment, the configuration of retrieval unit 111 is simplified, and output memory 116 and input memory 115 are directly connected with read unit 101. Therefore, the present exemplary embodiment provides the advantage in which read unit 101 can be controlled at high-speeds. This is possible because data at each clock cycle is stored in output memory 116 and values output from read unit 101 are stored in input memory 115 at each clock cycle.

When a memory element, whose first number is the same as that of a memory element at the time memory control unit 117 is operated immediately before, is operated, central control functional section 121 omits rewrite of the first number. When a clock signal is not supplied to the semiconductor device, central control functional section 121 omits the operation of memory control unit 117. Thus, further speed up is possible.

A description will be given of a second exemplary embodiment according to the present invention in detail below.

As shown in FIG. 8, the second exemplary embodiment has a configuration wherein clock control unit 112, user I/F functional section 131, number search functional section 123 and number database 124 have been added to the first embodiment shown in FIG. 1, and the other configuration is the same as the configuration of the first embodiment.

A detailed explanation will be given of clock control unit 112, user I/F functional section 131 and number search functional section 123.

Operation of central control functional section 121 will be explained in the flowchart of the present exemplary embodiment.

Clock control unit 112 supplies a clock signal to semiconductor device 100 and stops the supply of the clock signal in accordance with a command from central control functional section 121. In this case, by providing clock control unit 112 with the function (break setting function) of stopping the operation of the clock signal based on the value at the output terminal of semiconductor device 100 and with the function of transmitting the clock signal for a specified number of cycles, memory elements can be observed at each one clock cycle, and operation of semiconductor device 100 can be stopped at a time at which one desires to observe values of the memory elements, thus providing a more excellent semiconductor verification device. Furthermore, when a circuitry such as CPU or DSP which operates through software is implemented within semiconductor device 100, a more excellent semiconductor verification device can be provided by controlling the supply of the clock signal and the stoppage thereof using a program counter, by gaining access to a memory within semiconductor device 100, by detecting write to or read from a specified address for the control of the supply of the clock signal and the stoppage thereof, and by allowing the designation of times to reach a break point. Conditions for the stoppage of the clock signal of clock control unit 112 include, for example, 1) a value of a specified output terminal of semiconductor device 100 has become a specified value, 2) a value of a specified output terminal of semiconductor device 100 has reached a specified range or has moved out of a specified range 3) a break occurs in one or more devices within semiconductor device 100 which operate through software, such as CPU, DSP, etc.

4) any one of 1), 2) and 3) has occurred a specified number of times, 5) a combination of above conditions.

By stopping the clock signal with one or more of these conditions, a more excellent semiconductor verification device can be provided. Further, in the case of a hardware emulator, since a circuit to be operated can be changed, all signals of semiconductor device 100 can be utilized for break conditions (conditions for stopping the clock signal). This allows a finer control. For example, assume that the break condition is set such that the clock signal is stopped when an event in which signal A is 1 and signal B is 10, has occurred two times. In this case, when this break condition is satisfied, the clock signal is stopped.

User I/F functional section (input means, display means) 131 has a function to receive a name of a desired memory element from a user and to display a value of an observed memory element for the user. A name of a desired memory element may be directly entered from a keyboard in a general computer having a CPU, a display device, a mouse, a keyboard, etc. Alternatively, an auxiliary function may be provided in which a list of memory elements included in semiconductor device 100 is displayed on the display device, and in which a user designates a memory element in the list through the operation of the mouse. Further, if an auxiliary function is provided in which a user can designate bus signals in a lump, or can designate the entire memory, a more excellent verification apparatus can be provided.

In displaying values, not only a value is displayed for each one bit, but also a bus signal may be displayed together with the value. Further, a value is displayed not only in binary notation, but also in hexadecimal notation, in decimal notation, in a waveform, and etc. Thus, a more excellent verification device can be provided. Further, in the present exemplary embodiment, in addition to the name of a memory element of which observation is desired, the first and second numbers may be directly entered from I/F functional section 131. This configuration can obviate the operation of number search functional section 123, thus speeding up the retrieval operation accordingly.

Number search functional section 123 has a function of, using as a search key, the name of a memory element entered from user I/F functional section 131 whose value is to be retrieved, searching the first and second numbers corresponding to the memory element from database 124 to generate number information 130. FIG. 2 shows by way of example number database 124.

Number database 124 stores the first and second numbers for all memory elements, as shown in FIG. 2, for example. Specific example thereof is Logic Location File (FIGS. 8-8 in Non-patent Document 1) in FPGA number database 124 by XILINKS Corporation, which describes names of memory elements within semiconductor device 100, the first numbers (Frame Address) and the second numbers (Frame Offset). FIG. 9 is an excerpt from Logic Location File in which No. 3 column is the first number (Frame Address), No. 4 column is the second number (Frame Offset), and No. 7 column is the name of a memory element.

A description will now be given of the overall operation of the present exemplary embodiment in detail with reference to the flowchart of FIG. 10.

As shown in FIG. 10, in the operation of the present exemplary embodiment, steps 2002, 2003, 2004, 2005, 2009, 2010 and 2011 have added to the steps of the previous embodiment. Detailed explanations of these steps will now be given.

At step 2002, central control functional section 121 establishes a break point. Specifically, at this step, the user sets the number of the clock signals after which the clock signal is stopped and the specific value of a signal of semiconductor device 100 at which the supply of the clock signal is stopped, etc., to clock control unit 112 via user I/F functional section 131 and central control functional section 121. However, the content to be set varies depending on the function possessed by clock control unit 112.

Upon completion of the setting of a break point, at step 203 in FIG. 10, central control functional section 121 causes clock control unit 112 to operate to supply the clock signal to semiconductor device 100. Semiconductor device 100 then initiates its operation. At this step, when the break point that is established at step 2002 is reached, clock control unit 112 stops the supply of the clock signal. Semiconductor device 100 then stops its operation. If all the clock signals are stopped at this time, other semiconductor device (s) (for example, a circuit for performing a refresh operation of DRAM, or a circuit for giving data to and receiving data from the outside) may not operate properly. Thus, supplies of the clock signals may be partially stopped. However, the clock signal related to a desired signal needs to be completely stopped.

At step 2004 in FIG. 10, a desired memory element (hereinafter referred to as observed signal) is designated. At this step, for example, user I/F functional section 131 displays all the memory elements implemented within semiconductor device 100 so that the user may designate the observed signal. At this step, when the input value is the name of the observed signal, then central control functional section 121 causes operating number search functional unit 123 to operate so that it searches the first and second numbers based on the input name of the observed signal and stores them in number information storage section 130.

At step 2005, central control functional section 121 performs a control to determine whether or not the first number at this time is identical to the first number which was used when memory control unit 117 was operated last time and to determine whether or not step 2003 was executed from the last operation to the current operation. When the first number at this time is identical to the first number which was used when memory control unit 117 was operated last time and when step 2003 was not executed from the last operation to the current operation (the clock signal was not supplied to semiconductor device 100 from the last operation), control proceeds to step 408. When the first number at this time is identical to the first number which was used when memory control 117 was operated last time and when step 2003 was executed from the last operation to the current operation, control proceeds to step 407. When the first number at this time is not identical to the first number which was used when memory control 117 was operated last time, control proceeds to step 406.

At step 2009, central control functional section 121 transfers the value which was read at step 408 to user I/F functional section 131.

Meanwhile, at step 2010 in FIG. 10, user I/F functional section 131 displays the value read by central control functional section 121.

Furthermore, at step 2011 in FIG. 10, user I/F functional section 131 urges the user to indicate selection of operations (setting of a break point, designation of an additional observed signal, or completion of operations). When setting of a break point is indicated at this step, central control functional section 121 gives control to step 2002, and when an additional observed signal is indicated, central control functional section 121 gives control to step 2004.

Advantages of the present exemplary embodiment will now be described.

The present exemplary embodiment provides the advantages not only of speeding up the operation of retrieving values of memory elements, but also of retrieving from the name of a memory element the value of the element.

Furthermore, when the first number at this time is identical to the first number at the time memory control unit 117 was operated one time before, central control functional unit 121 obviates rewriting the first number, thus speeding up the operation of retrieving values of memory elements. When the clock signal is not supplied, central control functional section 121 obviates operation of memory control unit 117, thus further speeding up the operation of retrieving values of memory elements.

A description will now be given in detail of a third exemplary embodiment according to the present invention.

The third exemplary embodiment utilizes a programmable device such as FPGA, in place of semiconductor device 100 in FIG. 1, and operations of the respective units and sections and the overall operation of the present exemplary embodiment are the same as those of the first exemplary embodiment. The present exemplary embodiment can be combined with not only the first exemplary embodiment but also other embodiment(s).

The present exemplary embodiment provides advantages in that, although being inferior in operation speeds to the embodiment using semiconductor device 100, it exhibits high versatility and can be realized in any circuits which can be implemented on FPGA. In general, semiconductor device 100 varies in operating frequency, voltages to be applied and input I/F (LVTTL [Low Voltage TTL], HSTL [High Speed Transceiver Logic], LVDS [Low Voltage Differential Signaling] etc.), and packages (DIP [Dual Inline Package], BGA [Ball Grid Array] etc.) etc. Therefore, a dedicated board is sometimes required for implementing the present exemplary embodiment. However, FPGA, which is rewritable hardware, is used to emulate semiconductor device 100, allowing verification without using a dedicated board for each device.

Further, since FPGA by ZYLINKS Corp. is equipped with a read unit (function, method) for reading all memory elements by utilizing JTAG and SelectMAP (trademark) terminals, there is no need to newly equip semiconductor device 100 with read unit 101 (references: Patent document 1, Patent document 2 and Non-patent document 1). That is, when output memory 115 or input memory 116 is connected with JTAG or SelectMAP terminals through external terminals, values of all memory elements within the FPGA can be read.

A description will now be given in detail of a fourth exemplary embodiment according to the present invention.

As shown in FIG. 11, the fourth exemplary embodiment is the same as the second exemplary embodiment except that storage unit 500 is added, and operations of central control functional section 121 and retrieval functional section 122 are changed from those in the second exemplary embodiment.

Operations of central control functional section 121 and retrieval functional section 122, whose operations have been changed owing to the addition of storage unit 500, will be explained below in detail.

As opposed to the first exemplary embodiment, retrieval functional section 122 operates such that it reads values of all memory elements within input memory 116, stores the same in storage unit 500 together with the first number, and transfers the value of a desired memory element to central control functional section 121. Alternatively, the value of a desired memory element may be first read to be transferred to central control functional section 121, and then other data are read to be stored in storage unit 500. This makes the operation complicated, but speeds up the operational speed because of parallel operations.

Central control functional section 121 first searches storage unit 500 for data corresponding to the first number. When data corresponding to the first number are stored in storage unit 500, central control functional section 121 operates to calculate a value of the observed signal using the data and the second number, and to transfer the value to user I/F functional section 131. On the other hand, when data corresponding to the first number are not stored in storage unit 500, central control functional section 121 operates, similar to the second exemplary embodiment, to rewrite first numbers in output memory 116 through first number rewrite functional section 129; to cause memory control unit 117 to store data corresponding to the first number from read unit 101; to read data stored in input memory 115 using retrieval functional section 122; to store all the data and first numbers in storage unit 500; and to transfer the value of a desired memory element to central control functional section 121.

Subsequently, a description will be given of the overall operation of the present exemplary embodiment in detail with reference to the flowcharts of FIGS. 11 and 12.

However, the same steps as in the first exemplary embodiment will not be described in detail.

On the other hand, as shown in the flowchart of FIG. 12, the flowchart in the present exemplary embodiment differs from the flowchart of FIG. 10 in the second exemplary embodiment in that step 600 is newly added, and steps 2005, 408 and 2009 are changed to steps 601, 602 and 603, respectively.

At step 600, central control functional section 121 erases first number(s) and data corresponding thereto stored in storage unit 500. Since data may differ from clock cycle to clock cycle for semiconductor device 100, the data are discarded prior to the execution of clock operation step 403. However, step 600 may be executed immediately after clock operation step 2003.

At step 601, central control functional section 121 makes a check to determine whether or not data corresponding to the first number calculated at step 2004 are present in storage unit 500. When data corresponding to the first number are present in storage unit 500, then control proceeds to step 603. When data corresponding to the first number are not present in storage unit 500, then control proceeds to step 406.

At step 602, retrieval functional section 122 reads data in input memory 115. As mentioned hereinabove, input memory 115 stores data containing values of signals, unlike the second exemplary embodiment. Accordingly, retrieval functional section 122 reads all data, and stores them together with first numbers in storage unit 500.

At step 603, retrieval functional section 122 calculates a value of the observed signal based on data associated with the first number stored in storage unit 500 and the second number, and transfers the value to user I/F functional section 131 through central control functional section 121.

A description will now be given of a fifth exemplary embodiment according to the present invention in detail with reference to FIG. 13.

The fifth exemplary embodiment differs from the first exemplary embodiment in that total control unit 120 is changed and number search functional section 123, control information calculation functional section 701 and user I/F functional section 131 are newly added. Unlike the first exemplary embodiment, in the fifth exemplary embodiment, the user designates the observed signal (observed signal list 700) prior to operation of semiconductor device 100, and central control functional section 121 operates to retrieve only values of memory elements described in observed signal list 700.

A description will be given of specific operation of control information calculation functional section 701.

Control information calculation functional section 701 calculates control information 702 which retains therein the order in which observed signals are observed, based on observed signal list 700 previously presented by the user.

Specifically, control information calculation functional section 701 calculates control information 702 which allows retrieval of values of all the observed signals, by combining the two procedures:

Retrieval procedure 1) retrieval functional section 122 retrieves all data, and

Retrieval procedure 2) retrieval functional section 122 retrieves only values of ob the served signals.

According to Retrieval procedure 1, values of all memory elements within an entry can be retrieved with one retrieval operation, while according to Retrieval procedure 2, values associated with all memory elements within an entry are read a number of times which is equal to or less than the number of the memory elements within the entry.

A description will be given of the operation of control information calculation functional section 701 more concretely with reference to FIGS. 14, 15 and 16.

Now, assume that memory elements P, Q, R, S, T and U are designated in observed signal list 700, and first and second numbers associated with these memory elements are stored in number database 124 as shown in FIG. 14. At this time, control information calculation functional section 701 operates in accordance with the flowchart shown in FIG. 15 to generate control information 702 (FIG. 16).

First, control information calculation functional section 701 takes note of a certain memory element in observed signal list 700, and creates one entry consisting of memory elements in the observed signal list having the same first number as the first number of the certain memory element (step 900 in FIG. 15). The entry consists of a piece of information related to the aforementioned retrieval procedure, one first number, one or more second numbers, and name(s) of element(s) corresponding to the second number(s).

Next, control information calculation functional section 701 determines which of Retrieval procedure 1 or 2 is higher in operation for each entry, by calculating an operation time based on time A necessary for retrieval functional section 122 to read all data item, time B necessary for retrieval functional section 122 to read one signal, and the number N of memory elements included in the entry. That is, information concerning the retrieval procedure for the entry is set and stored such that when $A < B \times N$ (product of B and N), then Retrieval procedure 1 is selected, and otherwise, Retrieval procedure 2 is selected (steps 901, 902, and 903 in FIG. 15).

At subsequent step 904, it is determined whether or not all the observed signals are processed. When all the observed signals have been processed, the processing in FIG. 15 is completed, and when processing of all the observed signals are not yet completed, control reverts to step 901.

When A=5 and B=2, control information 702 as shown in FIGS. 14 to 16 is obtained in accordance with the processing of the flowchart in FIG. 15.

Further, by sorting data in each entry in respect of the second number, when data are read from read unit 101, the data can be immediately transferred to central control functional section 121. Thus, the semiconductor verification apparatus can be operated at high speeds.

A description will be given of the overall operation of the present exemplary embodiment in detail with reference to FIG. 13 and the flowcharts of FIGS. 15 and 17.

The flowcharts of the present exemplary embodiment differ from the flowchart (FIG. 7) of the first exemplary embodiment in that steps 1100, 1101 and 1102 are added between steps 401 and 406, and step 408 is changed to step 1103. Steps which are added and replaced will be explained hereinafter in detail.

At step 1100, a memory element whose value is observed is designated at user I/F functional section 131 by the user. User I/F functional section 131 creates observed signal list 700 based on the information.

At step 1101, control information calculation functional section 701 creates control information 702 based on observed signal list 700 and in accordance with the flowchart of FIG. 15.

At step 1102, central control functional section 121 makes a check to determine whether or not an entry(s) which is (are) not yet processed is (are) present in control information 702. When an entry(s) is (are) not present, operation is completed, and when an entry(s) is (are) present, control proceeds to step 406 in order to process the entry.

At step 406, central control functional section 121 rewrites the value of the first number in the entry which was determined not to be processed at step 1102, using first number rewrite section 129.

At step 1103, central control functional section 121 causes retrieval functional section 122 to operate, in accordance with the aforementioned retrieval procedure in the entry which was determined not to be processed at step 1102.

According to the present exemplary embodiment, since retrieval unit 111 is operated only one time when observed signals having the same first number are read, by previously creating control information 702 prior to operation of memory control unit 117, retrieval operation can be carried out at quickly. In a general computer etc., reading data in a lump (collectively) is more efficient. Therefore, selecting either Retrieval procedure 1 wherein data is retrieved in a lump or Retrieval procedure 2 wherein data items are retrieved one by one, depending on the number of observed signals having the same first number, reduces the retrieval time. Furthermore, by simultaneously operating retrieval functional section 122 and first number rewrite functional section 129, the retrieval operation can be carried out more quickly.

A description will be given of a sixth exemplary embodiment according to the present invention in detail.

The sixth exemplary embodiment concerns an embodiment in which the number of semiconductor devices is plural, and each read unit can be controlled using separate terminals.

As shown in FIG. 18, the present exemplary embodiment differs from the second exemplary embodiment in that semiconductor device 100 is constituted by plural semiconductor devices 100.1-100.N and device control unit 110 is constituted by plural device control units 110.1-110.N. However, the operation of each unit is not changed and location information is used which indicates which of semiconductor devices 100.1-100.N includes a memory element to be retrieved. The overall operation of the present exemplary embodiment is the same as that of the first exemplary embodiment except that location information of semiconductor devices 100.1-100.N are exchanged, and will not be explained herein.

According to the method shown in the present exemplary embodiment, the present invention can be readily applied to plural semiconductor devices 100.1-100.N. Further, it can be readily recognized that the present exemplary embodiment can also be applied to the third, fourth and fifth exemplary embodiments in which the number of semiconductor devices is one. Furthermore, since retrieval units 111.1-111.N can be operated independently in the present exemplary embodiment, the reading operation can be carried out more quickly, by operating the retrieval units simultaneously.

A description will be given of a seventh exemplary information according to the present invention in detail.

In the seventh exemplary embodiment, a plurality of semiconductor devices 100.1 to 100.N are provided, and read units 101.1 to 101.N in respective semiconductor devices 100.1 to 100.N are controlled via a common terminal. For example, semiconductor devices 100.1 to 100.N are JTAG-chain connected. As shown in FIG. 19, the present exemplary embodiment differs from the second exemplary embodiment in that it includes N semiconductor devices 100.1 to 100.N and N output memories 116.1 to 116.N, and additionally includes selection unit 1300.

A description will be given of operations of output memories 116.1 to 116.N and selection unit 1300 in detail. The present exemplary embodiment is the same as the second exemplary embodiment as regards other functions except that functions are extended so that position information of semiconductor devices 100.1 to 100.N can be treated.

Output memories 116.1 to 116.N store each cycle a value at input terminals necessary for controlling respective read units 101.1 to 101.N to read values, and the content of output memory 116.X is used for controlling read unit 101.X (where X=1 to N). In the JTAG-chain connection, data is transmitted from a JTAG terminal to relevant semiconductor device utilizing a bypass command, but data to be input differs depending on the number of the semiconductor devices which are present between the JTAG terminal and the relevant semiconductor device. Conversely, the output from the relevant semiconductor device and its output timing differ depending on the number of semiconductor devices through which the output passes from the relevant semiconductor device to the JTAG terminal. Therefore, a control signal which is provided to each semiconductor device differs depending on the position of the semiconductor device in the JTAG chain. Furthermore, since the JTAG provides data to the read unit that utilizes two signals: TDI and TMS, it entails a complicated calculation procedure for calculating the value of the data. In the present exemplary embodiment, in order to avoid this complicated calculation procedure, data necessary for reading the value of each of semiconductor devices 100.1 to 100.N are previously calculated by a computer etc., and the data are stored in respective output memories 116.1 to 116.N for each semiconductor device.

Selection unit 1300 selects, based on the information of a semiconductor device where a memory element is present the value of which is desired to retrieve, data of the output memory corresponding to the semiconductor device, and supplies this data to read unit 101.1. Since data of semiconductor devices other than the relevant semiconductor device are neglected, retrieval operation can be speeded up, by providing common signals to output memories 116.1 to 116.N as address signals and enable signals from memory control unit 117.

The present exemplary embodiment provides the advantage in which even when semiconductor devices 100.1 to 100.N are connected in the JTAG chain, the semiconductor verification apparatus can be operated at high speeds.

A description will be given of an eighth exemplary embodiment according to the present invention in detail.

The eighth exemplary embodiment will be explained with reference to FIGS. 20 and 21. As shown in FIG. 20, the eighth exemplary embodiment differs from the first exemplary embodiment in that memory connector 2004 is arranged in place of output memory 117, and nonvolatile memory 2002 is detachably mounted on memory connector 2004. Initial value information 127 is previously stored in nonvolatile memory 2002 by the time it is mounted on memory controller 2004. Accordingly, since there is no need to recalculate the content of initial value information 127, the time required to calculate initial value information 127 is reduced.

Subsequently, a description will be given of operation of the eighth exemplary embodiment using FIG. 21. The eighth exemplary embodiment differs from the first exemplary embodiment in that the step of mounting nonvolatile memory 2002 onto memory connector 2004 (step 301 in FIG. 21) has been newly added.

On the other hand, step 401 of setting the output memory is dispensed with, thus reducing processing time by the time spent in this step. Subsequent steps are the same as in the first exemplary embodiment.

Effects of the present exemplary embodiment will be described.

The eighth exemplary embodiment provides the advantages in which the processing time is reduced by the time spent in the step of setting the output memory because setting of the initial value is obviated and nonvolatile memory 2002 is previously mounted onto memory connector 2004.

A description will be given of operation of the present exemplary embodiment using the specific examples.

As shown in FIG. 22, the present exemplary embodiment comprises: general computer 1400 which includes CPU 1401, RAM 1402, bridge 1403 and HDD 1404; PCI (Peripheral Component Interconnect) bus 1405 which is a general-purpose bus; semiconductor test apparatus 1406 connected with computer 1400 via PCI bus 1405; input unit 1408 which realizes user I/F functional section 131; and display unit 1409.

Computer 1400 realizes total control functional section 120. HDD 1404 in computer 1400 stores programs associated with total control functional section 120, device control information 125, initial value information 127, first position information 132 and second position information 128. Of course, alternatively, these programs and information may be stored in RAM 1402.

Semiconductor test apparatus 1406 comprises control FPGA 1407 which realizes device control unit 110 and clock control unit 112, and semiconductor device 100. Control I/F 113 performs data exchange with PCI bus 1405.

A description will be given of the specific embodiment with reference to FIGS. 1, 7 and 14.

First, calculation of the initial value is initiated (step 300 in FIG. 7). In this step, after power is applied to computer 1400, CPU 1401 executes a program which realizes initial value calculation functional section 126 to generate initial value information 127, first position information 132 and second position information 128 from device control information 125 stored in RAM 1402 or HDD 1404 for storing the same in RAM 1402 or HDD 1404.

Next, operation of the semiconductor device is initiated (step 400 in FIG. 7). In general, operation of semiconductor test apparatus 1406 is initiated (power is applied). In this step, when semiconductor device 100 is constituted by the FPGA, for example, configuration of the FPGA, activation of an operating system on the computer side, and initialization of a PCI bus interface circuit included in control FPGA 1407 for allowing the control of PCI bus 1405 from computer 1400 are carried out. This step 400 may be carried out simultaneously with step 300 or may be carried out at different time with step 300.

Next, the value of initial value information 127 is set to output memory 116 (step 401 in FIG. 7). In this step, the program of central control functional section 121 which is realized as CPU 1401 reads initial value information 127 stored in RAM 1402 or HDD 1404, and sets the data to output memory 116 implemented within the control FPGA. However, since a memory within the FPGA can be provided with an initial value, FPGA data which is information corresponding to initial value information 127 may be previously created as an initial value of the output memory. This obviates step 401.

Next, central control functional section 121 which is embodied as a program which runs on computer 1400 executes a program, which embodies first number rewrite functional section 129, to control the first number stored in RAM 1402 or HDD 1404 via bridge 1403 and PCI bus 1405 to rewrite the portion corresponding to the first number in output memory 116 which is embodied as control FPGA 1407 (step 406 in FIG. 7).

Next, central control functional section 121, which is embodied as a program which runs on computer 1400, controls memory control unit 117 which is embodied in the control FPGA via PCI bus 1405 to cause it to start its operation. As a result, the value of initial value information 127 stored in output memory 116 is supplied to the input terminal of read unit 101 in semiconductor device 100. At the same time, memory control unit 117 performs control such that the value of the observed signal output from semiconductor device 100 is stored in input memory 115 (step 407 in FIG. 7).

Next, central control functional section 121 which is embodied as a program which runs on computer 1400 controls retrieval functional section 122 which is also embodied as a program which runs on computer 1400 to cause it to retrieve the value of the observed signal stored in input memory 115 (step 408 in FIG. 7). At this time, retrieval functional section 122 retrieves data stored in input memory 115 which is implemented within the control FPGA, through PCI bus 1405.

By thus realizing portions which are unrelated to the operation speed, in software which runs on a computer, and by realizing portions which are related to the operation speed, in hardware, hardware is also simplified, and high-speed operation is possible.

Although the present invention has been described using certain preferred embodiments, it should be understood that these are only examples and are not intended to limit the present invention. It is apparent that various changes and replacements may be easily made by those skilled in the art and these changes and replacements are within the scope of the attached claims and the spirit of the present invention, after reading the specification of the present invention.

The present invention is applicable to semiconductor verification apparatuses and other systems similar thereto.

Although the present invention has been described with reference to the exemplary embodiment, the present invention is not limited to the exemplary embodiment. Various changes and modifications can be made for the configurations and details of the present invention without departing from the sprit of the present invention.

This application claims the benefit of priority based on Japanese Patent Application No. 2008-202475 filed on Aug. 5, 2008, the entire disclosure of which is hereby incorporated by reference.

100 semiconductor device
101 read unit
110 device control unit
111 retrieval unit
112 clock control unit
113 control I/F
115 input memory
116 output memory
117 memory control unit
120 total control functional section
121 central control functional section
122 retrieval functional section
123 number search functional section
124 number database
125 read unit control information
126 initial value calculation functional section
127 initial value information
128 second position information
129 first number rewrite function
130 number information
131 user I/F function
132 first position information

The invention claimed is:

1. A semiconductor verification apparatus for verifying circuits using a semiconductor device wherein memory elements contained therein are distinguished from one another by a first number and a second number; the apparatus comprising:
   read means that is implemented within said semiconductor device, and is controlled based on the value of said first number and read means control information to output the values of first memory elements associated with said first number to the outside of said semiconductor device;
   a first memory that is connected with an input terminal of said read means, and stores initial value information which are values to be output to said read means at each clock cycle based on said read means control information;
   a second memory that is connected with an output terminal of said read means, and stores the value at the output terminal of said read means at each clock cycle, the value including the values of said first memory elements associated with said first number;
   initial value calculation means that calculates first position information indicative of the position of said first number within said first memory and second position information of said second number within said second memory based on said read means control information;
   first number rewrite means that writes said first number alone in said first memory based on said first position information; and
   retrieval means that determines locations in said second memory at which the values of said memory elements are stored, based on said second number and second position information, and retrieves the values of memory elements associated with said second number with one retrieval operation,
   wherein the initial value information stored in said first memory is supplied to said read means, and values of said first memory element output from said read means are stored in said second memory.

2. The semiconductor verification apparatus according to claim 1 wherein it further comprises number search means that determines said first and said second numbers from a name of a memory element within said semiconductor device, and said semiconductor verification apparatus is activated through said first and said second numbers determined by said number search means.

3. The semiconductor verification apparatus according to claim 1 wherein it further comprises:
   memory control means that controls address terminals and enable terminals of said first and second memories to supply said initial value information stored in said first memory to said read means and to store the value of said memory element output from said read means in said second memory;
   clock control means that controls a clock signal for said semiconductor device; and
   central control means that controls said memory control means, said clock control means, said first number rewrite means and said retrieval means,
   wherein said central control means, when the supply of the clock signal to said semiconductor device is stopped, promotes input of the first and second numbers of a desired memory element, writes said first number to said first memory through said first number rewrite means, and operates said memory control means to retrieve the value of said memory element stored in said second memory, through said retrieval means.

4. The semiconductor verification apparatus according to claim 3 wherein said clock control means stops the supply of the clock signal when at least one of the following conditions is satisfied:
   1) a value of a signal at a specified output terminal of said semiconductor device is a specific value;
   2) a value of a signal at a specified output terminal of said semiconductor device reaches a specific range or moves out of the specific range;
   3) a break has occurred in a device that operates through software within said semiconductor device;
   4) any of 1), 2), or 3) has occurred a specified number of times; and
   5) a combination of 1) to 4).

5. The semiconductor verification apparatus according to claim 3 wherein said central control means obviates the operation of said first rewrite means when the value of said first number is the same as the value of the previous first number, and also obviates the operation of said memory control means when the clock signal has not been supplied to said semiconductor device from the time that the value of said memory element was lat retrieved.

6. The semiconductor verification apparatus according to claim 1 wherein
   it further comprises storage means that is connected with said retrieval means, that stores said first number and values of all memory elements associated with said first number, and that deletes the values when the clock signal is supplied to said semiconductor device; and
   said retrieval means has changed its operation such that it retrieves the value of said memory element from the values stored in said storage means when the value of said first number is stored in said storage means; and retrieves values of all memory elements associated with said first number stored in said second memory, stores the values of all memory elements associated with said first number in said storage means, and retrieves the value of said memory element from the values stored in said storage means when the value of said first number is not stored in said storage means.

7. The semiconductor verification apparatus according to claim 1 wherein
it further comprises:
control information that contains therein one or more entries each comprised of an item of information concerning the retrieval procedure that defines the operation of said retrieval means, one first number, and one or more second numbers;
a central control functional section that executes processes in all entries of said control information,
wherein said retrieval procedure includes a first procedure in which after all values stored in said second memory are retrieved, all values associated with said second number are calculated; and a second procedure in which values associated with the second number stored in said second memory are retrieved with retrieval operations, the number of which is equal to or less than the number of the second numbers that are present within the entry, and
wherein said retrieval procedure defines the operation of said retrieval means.

8. The semiconductor verification apparatus according to claim 7 wherein
it further comprises:
number search means that searches for the first and second numbers from the name of said memory element; and
control information calculation means that calculates said control information using an observed signal list that describes names of memory elements that are to be retrieved in the semiconductor verification apparatus,
wherein said control information calculation means:
causes said number search means to search for the first and second numbers from the names of memory elements described in said observed signal list; calculates times necessary for processing all elements having the same first number through the first and second procedures; creates entries comprised of the first numbers and memory elements having the first number, said entry being comprised of information concerning the retrieval procedure, one first number, one or more second numbers and memory elements; selects one of the plural procedures for the entry; and determines whether or not all observed signals have been processed to create said control information for retrieving values of all memory elements described in said observed signal list.

9. The semiconductor verification apparatus according to claim 1 wherein it comprises a plurality of semiconductor devices, and wherein it reads, from the semiconductor device whose memory elements are distinguished from one another by, in addition to said first and second numbers, location information indicative of a location in the semiconductor device, the values of the memory elements, wherein:
said first and second memories are provided for each of said semiconductor devices,
said first value calculation means calculates said initial value information and said first and second position information for each of said semiconductor devices,
said first number rewrite means writes said first number alone, based on said first position information corresponding to said location information, to said first memory corresponding to said location information, and
said retrieval means retrieves a value of the memory element associated with said second number with one retrieval operation from said second memory corresponding to said location information, based on said second number and said second position information corresponding to said location information.

10. The semiconductor verification apparatus according to claim 1 wherein it comprises a plurality of semiconductor devices, and wherein read means of said semiconductor device reads, from the semiconductor device for a boundary scan test whose memory elements are distinguished from one another by, in addition to said first and second numbers, location information indicative of a location of the semiconductor device, the values of the memory elements, wherein
it comprises:
said first memories each associated with each of said semiconductor devices, said first memories being JTAG-connected to one another;
selection means that selects a value at the output terminal of any one of all of said first memories, and supplies the value to the input terminal of said semiconductor device for a boundary scan test,
wherein said first value calculation means calculates said initial value information and said first and second position information for each of said semiconductor devices,
wherein said first number rewrite means writes said first number alone, based on said first position information corresponding to said location information, to said first memory corresponding to said location information;
wherein said retrieval means retrieves a value of the memory element associated with said second number from said second memory with one retrieval operation, based on said location information and said second position information corresponding to said location information; and
wherein said selection means supplies a value of said first memory corresponding to said location information to an input terminal of said JTAG chain.

11. A semiconductor verification method of verifying circuits using a semiconductor device whose memory elements are distinguished from one another by first and second numbers, by reading the values of said memory elements from said semiconductor device; the method comprising:
by a read function that is implemented within said semiconductor device, and is controlled based on the value of said first number and read means control information to output the values of memory elements associated with said first number to the outside of said semiconductor device;
by said read function, storing in a second memory values including the values of memory elements associated with said second number at each clock cycle;
by initial value calculation function, calculating first position information indicative of the location of said first number in a first memory that stores initial value information that are values to be output to said read function at each clock cycle based on said read means control information, and second position information of said second number in said second memory;
by first number rewrite function, writing said first number alone in said first memory based on said first position information; and
by retrieval function, determining locations in said second memory in which the values of memory elements associated with said second number are stored, based on said second number and said second position information, and retrieving the values of memory element associated with said second number from the locations with one retrieval operation, wherein the initial value information stored in said first memory is supplied to said read function, and values of said first memory elements output from said read function are stored in said second memory.

12. The semiconductor verification method according to claim 11 wherein it comprises, by number search means, determining said first and said second numbers from a name of a memory element within said semiconductor device; and the method is activated through said first and said second numbers determined by said number search means.

13. The semiconductor verification method according to claim 11 wherein it further comprises:

by memory control function, controlling address terminals and enable terminals of said first and second memories to supply said initial value information stored in said first memory to said read means and to store the value of said memory element output from said read means in said second memory;

by clock control function, controlling a clock signal for said semiconductor device; and by central control function, controlling said memory control function, said clock control function, said first number rewrite function and said retrieval function, wherein said central control function, when the supply of the clock signal to said semiconductor device is stopped, promotes input of the first and second numbers of a desired memory element, write said first number to said first memory through said first number rewrite means, and operates said memory control function to retrieve the value of said memory element stored in said second memory, through said retrieval function.

14. The semiconductor verification method according to claim 13 wherein said clock control function stops the supply of the clock signal when at least one of the following conditions is satisfied:

1) a value of a signal at a specified output terminal of said semiconductor device is a specific value;
2) a value of a signal at a specified output terminal of said semiconductor device reaches a specific range or moves out of the specific range;
3) a break has occurred in a device that operates through software within said semiconductor device;
4) any of 1), 2), or 3) has occurred a specified number of times; and
5) a combination of 1) to 4).

15. The semiconductor verification method according to claim 13 wherein by said central control function, obviating the operation of said first rewrite means when the value of said first number is the same as the value of the previous first number, and also obviating the operation of said memory control means when the clock signal has not been supplied to said semiconductor device from the time that the value of said memory element was last retrieved.

16. The semiconductor verification method according to claim 11 wherein it further comprises:

by storage function, storing said first number and values of all memory elements associated with said first number, and deleting the values when the clock signal is supplied to said semiconductor device; and said retrieval function has changed its operation such that it retrieves the value of said memory element from the values stored in said storage means when the value of said first number is stored in said storage means; and retrieves values of all memory elements associated with said first number stored in said second memory, stores the values of all memory elements associated with said first number and said second number in said storage means, and retrieves the value of said memory element from the values stored in said storage means when the value of said first number is not stored in said storage means.

17. The semiconductor verification method according to claim 11 wherein it further comprises:

control information containing one or more entries each comprised of a piece of information concerning the retrieval procedure that defines the operation of said retrieval function, one first number and one or more second number;

a central control functional function that executes processes all entries of said control information, said retrieval procedure includes a first procedure in which after all values stored in said second memory are retrieved, all values associated with said second number are calculated; and a second procedure in which values associated with the second numbers stored in said second memory are retrieved with retrieval operations, the number of which is equal to or less than the number of the second numbers that are present within the entry, said retrieval procedure defines the operation of said retrieval means.

18. The semiconductor verification method according to claim 17 wherein it further comprises:

by number search function, searching for the first and second numbers from the name of said memory element; and by control information calculation function, calculating said control information using an observed signal list that describes names of memory elements that are to be retrieved in the semiconductor verification apparatus, by said control information calculation function; causing said number search means to search for the first and second numbers from the names of memory elements described in said observed signal list; calculating times necessary for processing all elements having the same first number through the first and second procedures; creating entries comprised of the first numbers and memory elements having the first number; selecting one of the plural procedures for the entry; and determining whether or not all observed signals have been processed to create said control information for retrieving values of all memory elements described in said observed signal list.

19. The semiconductor verification method according to claim 11 wherein it comprise breaking a device within said semiconductor device that operates through software by previously establishing a break point.

20. A non-transitory recording medium storing a semiconductor verification program for verifying circuits using a semiconductor device wherein memory elements contained therein are distinguished from one another by a first number and a second number; for causing a computer to perform:

controlling read function that is implemented within said semiconductor device, based on the value of said first number and read means control information so that it to outputs the values of memory elements associated with said first number to the outside of said semiconductor device;

storing in a second memory a value at each clock cycle output from said read means, the value including the values of memory elements associated with said second number;

calculating first position information indicative of the location of said first number in a first memory that stores initial value information that are values to be output to said read function at each clock cycle based on said read means control information, and second position information that contains the position of said second number in said second memory;

writing only said first number in said first memory based on said first position information; and determining locations in said second memory at which the values of memory elements associated with said second number are stored, based on said second number and said second position information, and retrieving the values of memory elements associated with said second number with one retrieval operation, wherein the initial value information stored in said first memory is supplied to said read function, and values of said first memory elements output from said read function are stored in said second memory.

* * * * *